(12) United States Patent
Cha et al.

(10) Patent No.: US 11,735,278 B2
(45) Date of Patent: Aug. 22, 2023

(54) NON-VOLATILE MEMORY DEVICE, CONTROLLER FOR CONTROLLING THE SAME, STORAGE DEVICE HAVING THE SAME, AND METHOD OF OPERATING THE SAME

(71) Applicant: SAMSUNG ELECTRONICS CO., LTD., Suwon-si (KR)

(72) Inventors: Sangsoo Cha, Suwon-si (KR); Sewoong Lee, Yongin-si (KR); Younsoo Cheon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 50 days.

(21) Appl. No.: 17/535,881

(22) Filed: Nov. 26, 2021

(65) Prior Publication Data
US 2022/0392516 A1    Dec. 8, 2022

(30) Foreign Application Priority Data

Jun. 2, 2021    (KR) .................. 10-2021-0071352

(51) Int. Cl.
*G11C 16/34*    (2006.01)
*G11C 16/26*    (2006.01)

(52) U.S. Cl.
CPC ............ *G11C 16/349* (2013.01); *G11C 16/26* (2013.01)

(58) Field of Classification Search
CPC ................................ G11C 29/44; G11C 29/42
USPC ........................................................ 365/200
See application file for complete search history.

(56) References Cited

U.S. PATENT DOCUMENTS

| 7,679,133 | B2 | 3/2010 | Son et al. |
| 7,843,498 | B2 | 11/2010 | Takahashi et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,053,808 | B2 | 6/2015 | Sprouse et al. |

(Continued)

FOREIGN PATENT DOCUMENTS

| KR | 10-1369444 B1 | 3/2014 |
| KR | 10-2016-0091499 A | 8/2016 |

(Continued)

OTHER PUBLICATIONS

European Search Report dated Aug. 8, 2022, Cited in Corresponding EP 22156741.5.

*Primary Examiner* — Anthan Tran
(74) *Attorney, Agent, or Firm* — Fish & Richardson P.C.

(57) ABSTRACT

A method of operating a controller includes randomly transmitting a first command to a non-volatile memory device upon a read request from a host; receiving first read data corresponding to the first command from the non-volatile memory device; determining whether the number of first error bits of the first read data is greater than a first reference value; determining whether the number of first error bits is greater than a second reference value, when the number of first error bits is not greater than the first reference value; storing a target wordline in a health buffer, when the number of first error bits is greater than the second reference value; periodically transmitting a second command to the non-volatile memory device; and receiving second read data corresponding to the second command from the non-volatile memory device.

15 Claims, 16 Drawing Sheets

(56) References Cited

U.S. PATENT DOCUMENTS

| | | |
|---|---|---|
| 9,536,970 B2 | 1/2017 | Seol et al. |
| 9,613,711 B2 | 4/2017 | Kim et al. |
| 9,690,654 B2 | 6/2017 | No et al. |
| 10,090,046 B2 | 10/2018 | Park et al. |
| 10,559,362 B2 | 2/2020 | Shin et al. |
| 10,607,708 B2 | 3/2020 | Oh et al. |
| 10,629,259 B2 | 4/2020 | Jang |
| 10,802,728 B2 | 10/2020 | Lee et al. |
| 2012/0110417 A1 | 5/2012 | D'Abren et al. |
| 2014/0281133 A1 | 9/2014 | Karamcheti et al. |
| 2015/0331625 A1 | 11/2015 | Nishikubo et al. |
| 2016/0104539 A1 | 4/2016 | Kim et al. |
| 2016/0217032 A1 | 7/2016 | Yum et al. |
| 2016/0225461 A1 | 8/2016 | Tuers et al. |
| 2016/0268006 A1 | 9/2016 | Tanaka |
| 2016/0365158 A1 | 12/2016 | Yang |
| 2017/0160934 A1 | 6/2017 | Park |
| 2017/0177425 A1 | 6/2017 | Jei et al. |
| 2019/0179741 A1 | 6/2019 | Liu |
| 2019/0371418 A1* | 12/2019 | Kim ................. G11C 29/44 |
| 2020/0098436 A1 | 3/2020 | Kim et al. |
| 2020/0110708 A1 | 4/2020 | Ma et al. |
| 2020/0151539 A1 | 5/2020 | Oh et al. |
| 2020/0176045 A1 | 6/2020 | Jung |
| 2020/0387313 A1 | 12/2020 | Lee et al. |
| 2020/0394114 A1 | 12/2020 | Lee et al. |
| 2020/0409788 A1 | 12/2020 | Kurose et al. |
| 2021/0050067 A1 | 2/2021 | Oh et al. |
| 2021/0109669 A1 | 4/2021 | Wisnovsky et al. |
| 2022/0011973 A1* | 1/2022 | Kim ................. G11C 11/5671 |

FOREIGN PATENT DOCUMENTS

| | | |
|---|---|---|
| KR | 10-2016-0146332 A | 12/2016 |
| KR | 10-2017-0065726 A | 6/2017 |
| KR | 10-2017-0073794 A | 6/2017 |
| KR | 10-2020-0039882 A | 4/2020 |
| KR | 10-2020-0065298 A | 6/2020 |
| KR | 10-2020-0143107 A | 12/2020 |
| KR | 10-2250423 B1 | 5/2021 |

* cited by examiner

NON-VOLATILE MEMORY DEVICE, CONTROLLER FOR CONTROLLING THE SAME, STORAGE DEVICE HAVING THE SAME, AND METHOD OF OPERATING THE SAME

CROSS-REFERENCE TO RELATED APPLICATION(S)

This application claims benefit of priority to Korean Patent Application No. 10-2021-0071352 filed on Jun. 2, 2021, in the Korean Intellectual Property Office, the disclosure of which is incorporated herein by reference in its entirety.

BACKGROUND

The present disclosure relates to a non-volatile memory device, a controller for controlling the same, a storage device including the same, and a method of operating the same.

In general, a storage device including a NAND flash memory such as a solid-state drive (SSD), a memory card, and the like are widely used. The NAND flash memory may store data by changing threshold voltages of memory cells and may read the data using a predetermined read voltage level. However, as the threshold voltages of the memory cells are changed due to degradation of the memory cells, a read fault may occur.

SUMMARY

An aspect of the present disclosure may be to provide a non-volatile memory device for improving data reliability, a controller for controlling the same, a storage device including the same, and a method of operating the same.

According to an aspect of the present disclosure, a method of operating a storage device includes performing a first read operation on at least one first target wordline upon a read request from a host; determining whether the number of first error bits of read data according to the first read operation is greater than a first reference value; determining whether the number of first error bits is greater than a second reference value, when the number of first error bits is not greater than the first reference value; storing wordline information corresponding to the at least one first target wordline in a health buffer, when the number of first error bits is greater than the second reference value; performing a second read operation on at least one second target wordline; determining whether the number of second error bits of read data according to the second read operation is greater than the first reference value; determining whether the health buffer is empty, when the number of second error bits is not greater than the first reference value; performing a third read operation using the wordline information stored in the health buffer, when the health buffer is not empty; and determining whether the number of third error bits of read data according to the third read operation is greater than the first reference value.

According to an aspect of the present disclosure, a method of operating a controller includes randomly transmitting a first command to a non-volatile memory device upon a read request from a host; receiving first read data corresponding to the first command from the non-volatile memory device; determining whether the number of first error bits of the first read data is greater than a first reference value; determining whether the number of first error bits is greater than a second reference value, when the number of first error bits is not greater than the first reference value; storing a target wordline in a health buffer, when the number of first error bits is greater than the second reference value; periodically transmitting a second command to the non-volatile memory device; and receiving second read data corresponding to the second command from the non-volatile memory device.

According to an aspect of the present disclosure, a storage device includes a plurality of memory blocks including at least two strings between respective bit lines and a common source line, each of the at least two strings including at least one string select transistor connected in series between one of the bit lines and the common source line, a plurality of memory cells, and at least one ground transistor. The at least one string select transistor having a gate connected to a string select line. Each of the plurality of memory cells receiving a wordline voltage from a wordline corresponding thereto. The at least one ground transistor having a gate connected to a ground select line. A control logic configured to perform at least one on-chip valley search (OVS) operation on memory cells connected to a first wordline of one memory block, among the plurality of memory blocks, in response to a first command, output detection information of the at least one OVS read operation to an external device, perform a read operation connected to the memory cell connected to the first wordline in response to a second command, and output read data of the read operation to the external device.

According to an aspect of the present disclosure, a storage device includes at least one non-volatile memory device. A controller controls the at least one non-volatile memory device. The controller includes a buffer memory storing data necessary for an operation. An error correction circuit corrects an error of data read from the at least one non-volatile memory device. A processor drives a plurality of health check units. Each of the plurality of health check units is configured to control the at least one non-volatile memory device to perform a read operation, a machine learning operation, or a cell count operation to check health of memory cells. The buffer memory includes at least one health buffer sharing health information corresponding to the plurality of health check units.

According to an aspect of the present disclosure, a method of operating a storage device includes periodically performing a first patrol read operation corresponding to a fixed target wordline for each memory block; performing a second patrol read operation corresponding to a variable target wordline excluding the fixed target wordline; and performing a reclaim operation on a memory block corresponding thereto, when the number of error bits according to the first patrol read operation or the second patrol read operation is greater than a reference value.

According to an aspect of the present disclosure, a non-volatile memory device includes a memory cell region having a first metal pad; and a peripheral circuit region having a second metal pad and vertically connected through the first metal pad and the second metal pad. The memory cell region includes a memory cell array including a plurality of memory blocks having a plurality of memory cells connected to a plurality of wordlines and a plurality of bit lines. The peripheral circuit region includes a row decoder selecting a wordline among the plurality of wordlines. The peripheral circuit region includes a page buffer circuit having a plurality of page buffers connected to the plurality of bit lines. The peripheral circuit region includes a control logic configured to receive a command latch enable (CLE) signal, an address latch enable (ALE) signal, a chip enable (CE) signal, a write enable (WE) signal, a read enable (RE)

signal, and a data strobe (DQS) signal through control pins and latch a command or an address at an edge of the WE signal according to the CLE signal and the ALE signal to perform first and second background read operations. The control logic is configured to perform a first read operation on memory cells connected to a first wordline by the first background read operation; periodically perform a second read operation on memory cells connected to second wordlines by the second background read operation; and perform a third read operation on memory cells connected to the first wordline by the second background read operation.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

In the following, the contents of the present disclosure will be described clearly and in detail to the extent that those of ordinary skill in the technical field of the present disclosure may easily implement it using the drawings.

In general, a NAND flash memory-based solution product such as a solid state drive (SSD) or a universal flash storage (UFS) may be equipped with various technologies slowing degradation of a NAND flash memory caused by user usage or the like to extend a lifespan of the product. This may be collectively referred to as a defense code. Such degradation of the NAND flash memory may be caused by process miniaturization and various external environmental factors. The degradation of the NAND flash memory may increase the number of error bits in read data. This may make it difficult to recover data by an error correction code (ECC), thereby deteriorating reliability of the product. A role of the defense code is to maximally suppress an increase in errors caused by the degradation of the NAND flash memory, to help data recovery by ECC.

The defense code may be narrowly defined as a software recovery algorithm. The defense code may be implemented by firmware in the solution product. In addition, the defense code may be defined more broadly, including an algorithm for improving characteristics in a NAND flash memory unit, ECC hardware intellectual property (IP) in a controller, or the like. In general, a defense code algorithm for preventing the degradation of the NAND flash memory may be largely divided into prevention technology and recovery technology. The prevention technology may be technology for preemptively protecting the NAND flash memory from degradation, including garbage collection (e.g., block management), wear leveling (e.g., pursuing uniform degradation), read reclaim (e.g., pre-blocking of default by predicting and writing down a degree of degradation), or the like. A technology for extending a lifespan by using variable parameters according to a program-erase (PE) cycle may also be broadly classified as prevention technology. The recovery technology may be defined as technology for reducing errors to correct errors when error correction fails in an ECC circuit (when there are too many errors) or technology in which the ECC circuit correct errors. A typical recovery technology may be technology for moving a read level to an optimal position to reduce the number of errors when the number of errors increases due to an incorrect read level.

A non-volatile memory device, a controller for controlling the same, a storage device including the same, and a method of operating the same, according to embodiments of the present disclosure, may share a buffer memory storing health information monitored by different defense codes and may use the health information of the buffer memory in each of the defense codes, to improve reliability for data.

Figure 1:
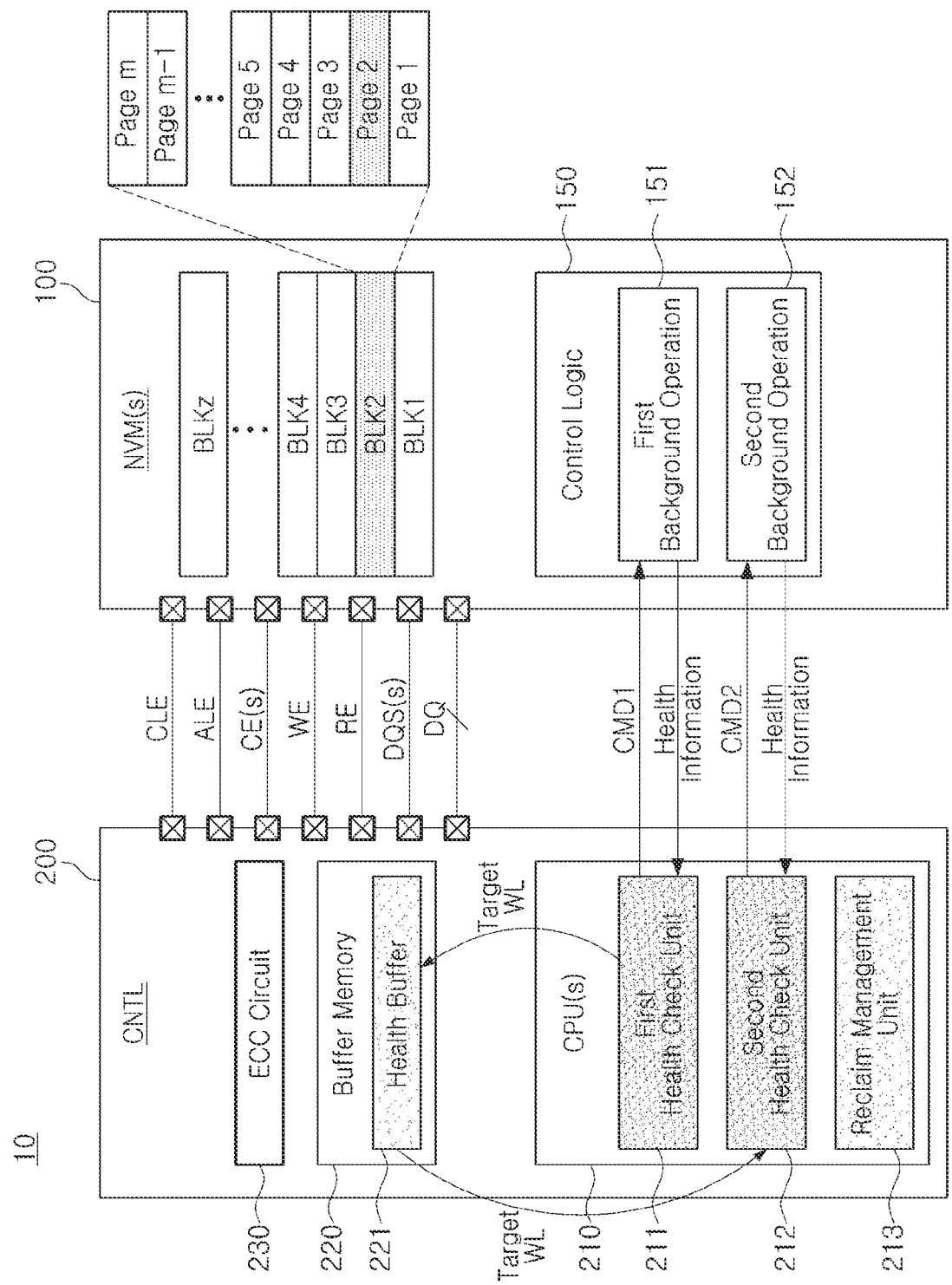
FIG. 1 is a diagram illustrating a storage device according to embodiments of the present disclosure.

FIG. 1 is a diagram illustrating a storage device according to embodiments of the present disclosure. Referring to FIG. 1, a storage device 10 may include at least one non-volatile memory device NVM(s) 100 and a controller CNTL 200.

At least one non-volatile memory device 100 may be implemented to store data. The non-volatile memory device 100 may be a NAND flash memory, a vertical NAND flash memory, a NOR flash memory, a resistive random-access memory (RRAM), a phase-change memory (PRAM), a magnetoresistive random access memory (MRAM), a ferroelectric random access memory (FRAM), a spin transfer torque random access memory (STT-RAM), or the like. Also, the non-volatile memory device 100 may be implemented to have a three-dimensional array structure. The present disclosure may be applied to a flash memory device in which a charge storage layer is formed of a conductive floating gate, as well as a charge trap flash (CTF) memory device in which a charge storage layer is formed of an insulating film. In the following, for convenience of description, the non-volatile memory device 100 will be referred to as a vertical NAND (VNAND) flash memory device.

In addition, the non-volatile memory device 100 may be implemented to include a plurality of memory blocks BLK1 to BLKz, where z is an integer equal to or greater than 2, and a control logic 150. Each of the plurality of memory blocks BLK1 to BLKz may include a plurality of pages Page 1 to Page m, where m is an integer equal to or greater than 2. Each of the plurality of pages Page 1 to Page m may include a plurality of memory cells. Each of the plurality of memory cells may store at least one bit.

The control logic 150 may receive a command and an address from the controller CNTL 200 and may be implemented to perform an operation (e.g., a program operation, a read operation, an erase operation, or the like) corresponding to the received command in memory cells corresponding to the address.

The controller CNTL 200 may be connected to the at least one non-volatile memory device 100 through a plurality of control pins transmitting control signals (e.g., a command latch enable (CLE) signal, an address latch enable (ALE) signal, a chip enable (CE) signal, a write enable (WE) signal, a read enable (RE) signal, and the like). Also, the controller CNTL 200 may be implemented to use the control signals (CLE, ALE, CE(s), WE, RE, or the like) to control the non-volatile memory device 100. For example, the non-volatile memory device 100 may latch a command (CMD) or an address (ADD) at an edge of the WE signal according to the CLE signal and the ALE signal, to perform a program operation a read operation or an erase operation. For example, during a read operation, the chip enable signal CE is activated, CLE is activated during a command transmission interval, ALE is activated during an address transmission interval, and RE indicates that data is transmitted through the data signal line DQ. It can be toggled in the transmission section. The data strobe signal DQS may be toggled with a frequency corresponding to the data input/output speed. The read data may be sequentially transmitted in synchronization with the data strobe signal DQS.

Also, the controller 200 may include at least one processor (e.g., a central processing unit (CPU)) 210, a buffer memory 220, and an error correction circuit 230.

The processor 210 may be implemented to control an overall operation of the storage device 10. The processor 210 may perform various management operations such as cache/buffer management, firmware management, garbage collection management, wear leveling management, data duplication removal management, read refresh/reclaim management, bad block management, multi-stream management, management of data of a host and mapping of a non-volatile memory, quality of service (QoS) management, system resource allocation management, non-volatile memory queue management, read level management, erase/program management, hot/cold data management, power loss protection management, dynamic thermal management, initialization management, redundant array of inexpensive disk (RAID) management, or the like.

In particular, the processor 210 may be implemented to drive a first health check unit 211, a second health check unit 212, and a reclaim management unit 213. In an embodiment, the first health check unit 211, the second health check unit 212, and the reclaim management unit 213 may be implemented in firmware/software.

Each of the first health check unit 211 and the second health check unit 212 may control background operations 151 and 152 corresponding to the non-volatile memory device 100, to monitor health of the memory cell. The background operations may include a read operation, a cell count operation, and an on-chip valley search (OVS) operation, respectively. In an embodiment, a first background operation 151 may be performed by a first command CMD1, and a second background operation 152 may be performed by a second command CMD2. In this case, the first command CMD1 and the second command CMD2 may be different from each other.

In addition, the first health check unit 211 and the second health check unit 212 may receive health information according to a background operation corresponding thereto, respectively, from the non-volatile memory device 100 and target wordline information corresponding to the health information may be stored in at least one health buffer 221 of the buffer memory 220.

In addition, the first health check unit 211 and the second health check unit 212 may determine whether a reclaim operation is required according to the background operation corresponding thereto, respectively, and may register target wordline information to be reclaimed, respectively.

The reclaim management unit 213 may use the registered reclaim information to store data of memory cells connected to a wordline corresponding thereto, in memory cells connected to another wordline. In an embodiment, such a reclaim operation may be performed periodically or aperiodically.

The buffer memory 220 may be implemented with a volatile memory (e.g., a static random-access memory (SRAM), a dynamic RAM (DRAM), a synchronous RAM (SDRAM), and the like) or a non-volatile memory (e.g., a flash memory, a phase-change RAM (PRAM), a magneto-resistive RAM (MRAM), a resistive RAM (ReRAM), a ferro-electric RAM (FRAM), and the like).

Also, the buffer memory 220 may include at least one health buffer 221 shared by the first and second health check units 211 and 212. In an embodiment, the at least one health buffer 221 may store health information according to a background operation. In this case, the health information may be used for health monitoring operations of the first and second health check units 211 and 212.

The ECC circuit 230 may be implemented to generate an error correction code during a program operation and use the error correction code during a read operation to recover data. For example, the ECC circuit 230 may generate an error correction code (ECC) for correcting a fail bit or an error bit of data received from the non-volatile memory device 100. The ECC circuit 230 may perform error correction encoding of data provided to the non-volatile memory device 100, to form data to which a parity bit is added. The parity bit may be stored in the non-volatile memory device 100.

In addition, the ECC circuit 230 may perform error correction decoding on the data output from the non-volatile memory device 100. The ECC circuit 230 may correct an error using the parity bit. The ECC circuit 230 may correct an error using a coded modulation such as a low-density parity check (LDPC) code, a BCH code, a turbo code, a Reed-Solomon code, a convolution code, a recursive systematic code (RSC), a trellis-coded modulation (TCM), a block coded modulation (BCM), or the like. When error correction is impossible in the error correction circuit 230, a read retry operation may be performed.

A storage device 10 according to embodiments of the present disclosure may perform health monitoring using different health check units 211 and 212 sharing target wordline information related to health information, to improve reliability for data.

Figure 2:
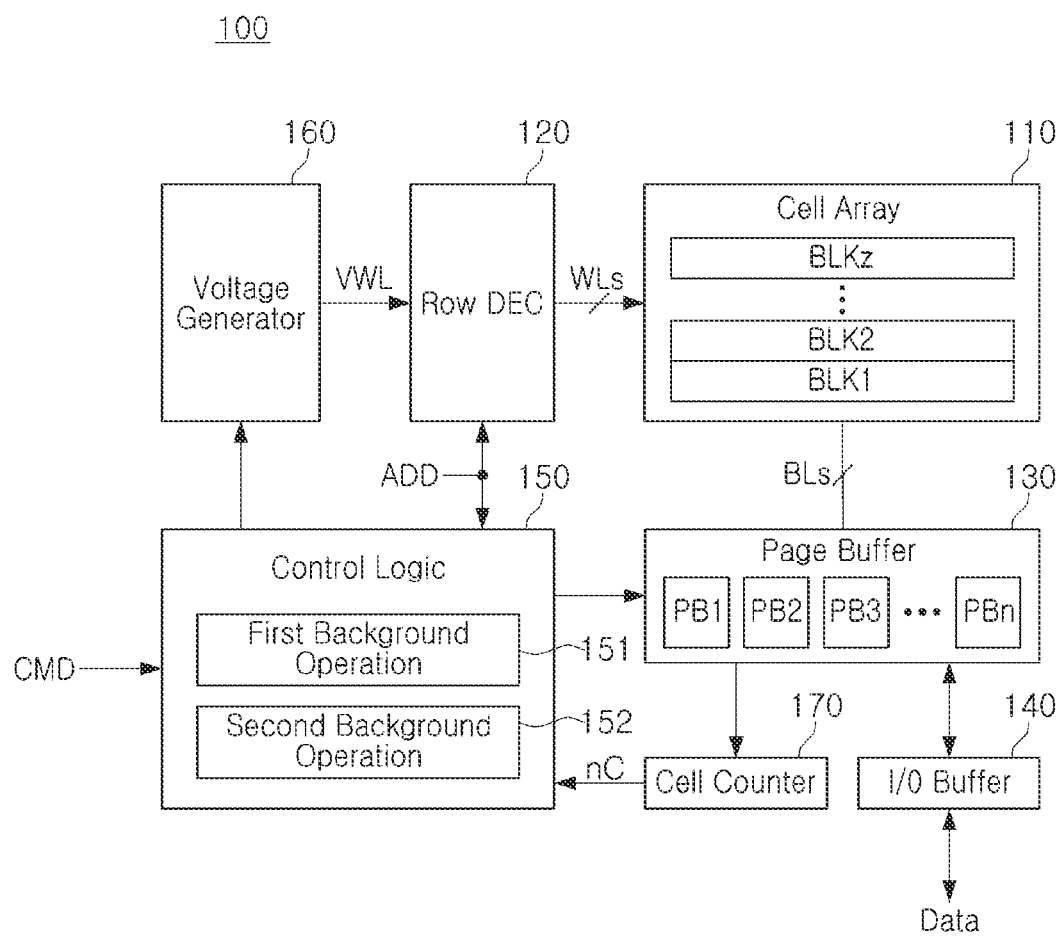
FIG. 2 is a diagram illustrating a non-volatile memory device illustrated in FIG. 1.

FIG. 2 is a diagram illustrating the non-volatile memory device illustrated in FIG. 1. Referring to FIG. 2, the non-volatile memory device 100 may include a memory cell array 110, a row decoder 120, a page buffer circuit 130, an input/output buffer circuit 140, a control logic 150, a voltage generator 160, and a cell counter 170.

The memory cell array 110 may be connected to the row decoder 120 through wordlines WLs or select lines SSL and GSL. The memory cell array 110 may be connected to the page buffer circuit 130 through bit lines BLs. The memory cell array 110 may include a plurality of cell strings. Each channel of the cell strings may be formed in a vertical direction or a horizontal direction. Each of the cell strings may include a plurality of memory cells. In this case, the plurality of memory cells may be programmed, erased, or read by a voltage provided to the bit lines BLs or the wordlines WLs. In general, a program operation may be performed on a page basis and an erase operation may be performed on a block basis. Details of memory cells will be described in U.S. Pat. Nos. 7,679,133, 8,553,466, 8,654,587, 8,559,235, and 9,536,970, which are incorporated herein by reference. In an embodiment, the memory cell array 110 may include a two-dimensional memory cell array and the two-dimensional memory cell array may include a plurality of NAND strings arranged in a row direction and a column direction.

The row decoder 120 may be implemented to select any of the memory blocks BLK1 to BLKz of the memory cell array 110 in response to an address ADD. The row decoder 120 may select any of wordlines of a selected memory block in response to the address ADD. The row decoder 120 may transfer a wordline voltage VWL, corresponding to an operation mode, to the wordlines of the selected memory block. During a program operation, the row decoder 120 may apply a program voltage and a verify voltage to a selected wordline and may apply a pass voltage to an unselected wordline. During a read operation, the row decoder 120 may apply a read voltage to a selected wordline and may apply a read pass voltage to an unselected wordline.

The page buffer circuit 130 may be implemented to operate as a write driver or a sensing amplifier. During a program operation, the page buffer circuit 130 may apply a bit line voltage corresponding to data to be programmed to the bit lines of the memory cell array 110. During a read operation or a verify read operation, the page buffer circuit 130 may sense data stored in the selected memory cell through the bit line BL. A plurality of page buffers PB1 to PBn included in the page buffer circuit 130, where n is an integer equal to or greater than 2, may be connected to at least one bit line, respectively.

Each of the plurality of page buffers PB1 to PBn may be implemented to perform sensing and latching for an OVS operation. For example, each of the plurality of page buffers PB1 to PBn may perform a plurality of sensing operations to identify one state stored in the selected memory cells under control of the control logic 150. In addition, after each of the plurality of page buffers PB1 to PBn stores data sensed by the plurality of sensing operations, one data may be selected under the control of the control logic 150. For example, each of the plurality of page buffers PB1 to PBn may perform the plurality of sensing operations to identify the one state. In addition, each of the plurality of page buffers PB1 to PBn may select or output optimal data, among a plurality of data, sensed according to the control of the control logic 150.

The input/output buffer circuit 140 may provide data (Data), externally provided, to the page buffer circuit 130. The input/output buffer circuit 140 may provide a command CMD, externally provided, to the control logic 150. The input/output buffer circuit 140 may provide an address ADD, externally provided, to the control logic 150 or the row decoder 120. In addition, the input/output buffer circuit 140 may output data sensed and latched by the page buffer circuit 130.

The control logic 150 may be implemented to control the row decoder 120 and the page buffer circuit 130 in response to a command CMD that is received (e.g., from the controller 200 of FIG. 1).

In addition, the control logic 150 may be implemented to perform the first background operation 151 or the second background operation 152 according to control of the controller 200 and output health information according to the first background operation 151 and the second background operation 152 to the controller 200.

The voltage generator 160 may be implemented to generate various types of wordline voltages to be respectively applied to wordlines under control of the control logic 150 and a well voltage to be supplied to a bulk (e.g., well region) in which memory cells are formed. The wordline voltages respectively applied to the wordlines may include a program voltage, a pass voltage, a read voltage, read pass voltages, or the like.

The cell counter 170 may be implemented to count the number of memory cells corresponding to a specific threshold voltage range from data sensed by the page buffer circuit 130. For example, the cell counter 170 may process data respectively sensed in the plurality of page buffers PB1 to PBn to count the number nC of memory cells having a threshold voltage in a specific threshold voltage range.

Figure 3:
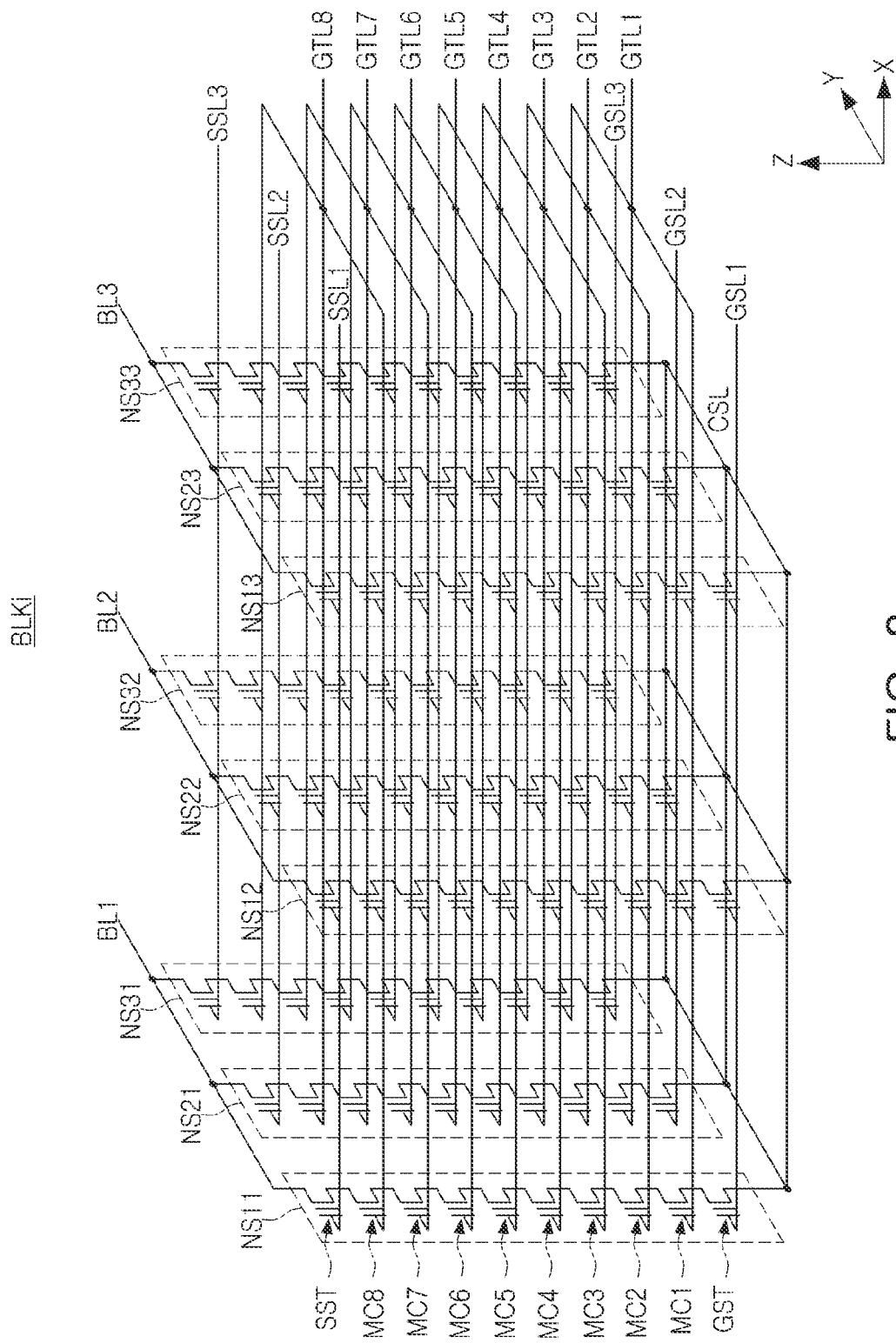
FIG. 3 is a diagram illustrating a circuit diagram of a memory block according to embodiments of the present disclosure.

FIG. 3 is a diagram illustrating a circuit diagram of a memory block BLKi (where i is an integer equal to or greater than 2) according to embodiments of the present disclosure. A plurality of memory NAND strings included in the memory block BLKi may be formed in a direction perpendicular to a substrate.

Referring to FIG. 3, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, . . . , and MC8, and a ground select transistor GST. In FIG. 3, each of the plurality of memory NAND strings NS11 to NS33 is illustrated as including eight memory cells MC1, MC2, . . . , and MC8, but is not limited thereto.

The string select transistor SST may be connected to string select lines SSL1, SSL2, and SSL3 corresponding thereto. The plurality of memory cells MC1, MC2, . . . , and MC8 may be respectively connected to gate lines GTL1, GTL2, . . . , and GTL8 corresponding thereto. The gate lines GTL1, GTL2, . . . , and GTL8 may correspond to wordlines, and a portion of the gate lines GTL1, GTL2, . . . , and GTL8 may correspond to dummy wordlines. The ground select transistor GST may be connected to ground select lines GSL1, GSL2, and GSL3 corresponding thereto. The string select transistor SST may be connected to the bit lines BL1, BL2, and BL3 corresponding thereto, and the ground select transistor GST may be connected to the common source line CSL.

Wordlines (e.g., WL1) having the same height may be connected in common, and the ground select lines GSL1, GSL2, and GSL3 and the string select lines SSL1, SSL2, and SSL3 may be separated from each other. FIG. 3 illustrates that the memory block BLKi is connected to eight gate lines GTL1, GTL2, . . . , and GTL8 and three bit lines BL1, BL2, and BL3, but is not necessarily limited thereto.

Figure 4:
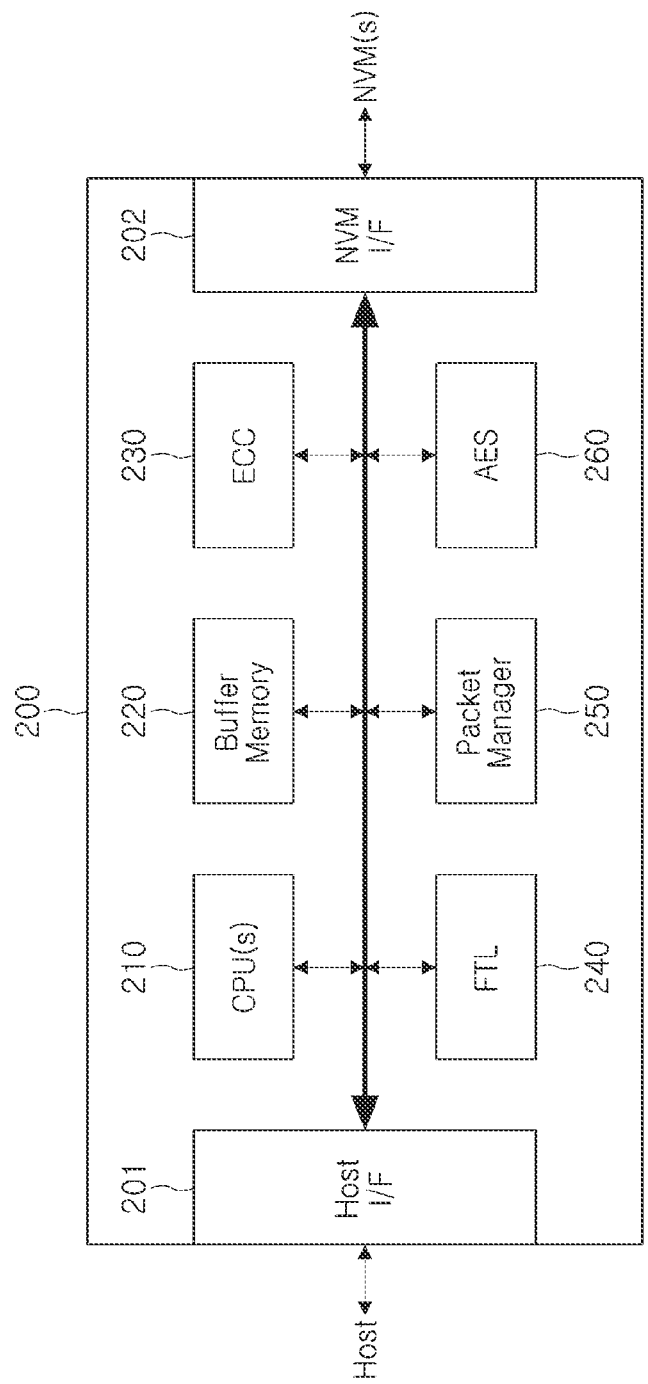
FIG. 4 is a diagram illustrating a controller according to embodiments of the present disclosure.

FIG. 4 is a diagram illustrating a controller according to embodiments of the present disclosure. Referring to FIG. 4, a controller 200 may include a host interface 201, a memory interface 202, at least one CPU 210, a buffer memory 220, an error correction circuit 230, a flash translation layer manager 240, a packet manager 250, and an encryption device 260.

The host interface 201 may be implemented to transmit and receive a packet to and from a host. A packet transmitted from the host to the host interface 201 may include a command or data to be written to a non-volatile memory 100. A packet transmitted from the host interface 201 to the host may include a response to a command or data read from the non-volatile memory 100. The memory interface 202 may transmit data to be written in the non-volatile memory 100 to the non-volatile memory 100 or receive data read from the non-volatile memory 100. This memory interface 202 may be implemented to comply with a standard protocol such as JDEC Toggle or ONFI.

The flash translation layer manager 240 may perform various functions such as address mapping, wear-leveling, and garbage collection. The address mapping operation may be an operation of converting a logical address, received from the host, into a physical address used to actually store data in the non-volatile memory 100. The wear-leveling may be technology for using blocks in the non-volatile memory 100 uniformly to prevent excessive degradation of a specific block therein and may be implemented, for example, by a firmware technique balancing erase counts of physical blocks. The garbage collection may be technology for copying valid data of an existing block to a new block and then erasing the existing block to secure capacity, usable in the non-volatile memory 100.

The packet manager 250 may generate a packet according to a protocol of an interface negotiated with the host or may parse various pieces of information from a packet received from the host. Also, the buffer memory 220 may temporarily store data to be written in the non-volatile memory 100 or data read from the non-volatile memory 100. In an embodiment, the buffer memory 220 may be a component provided in the controller 200. In another embodiment, the buffer memory 220 may be disposed outside the controller 200.

The encryption device 260 may perform at least one of an encryption operation and a decryption operation on data input to a storage controller 210, using a symmetric-key algorithm. The encryption device 260 may perform encryption and decryption of data using an advanced encryption standard (AES) algorithm. The encryption device 260 may include an encryption module and a decryption module.

FIGS. 5A, 5B, 5C, and 5D are diagrams conceptually illustrating sharing of a health buffer according to embodiments of the present disclosure.

Figure 5A:
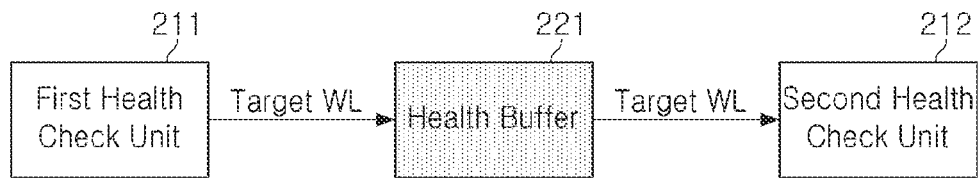
FIGS. 5A, 5B, 5C, and 5D are diagrams conceptually illustrating sharing of a health buffer according to embodiments of the present disclosure.

Referring to FIG. 5A, a first health check unit 211 may use health information according to a first background operation to generate target wordline information. In this case, the generated target wordline information may be stored in a health buffer 221. A second health check unit 212 may use not only predetermined wordline information but also the target wordline information stored in the health buffer 221 to perform a second background operation.

Figure 5B:
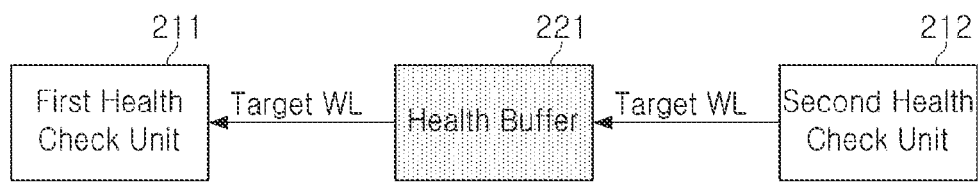

Referring to FIG. 5B, in contrast to that illustrated in FIG. 5A, a second health check unit 212 may use health information according to a second background operation to generate target wordline information. In this case, the generated target wordline information may be stored in a health buffer 221. A first health check unit 211 may use not only predetermined wordline information but also the target wordline information stored in the health buffer 221 to perform a first background operation.

Figure 5C:
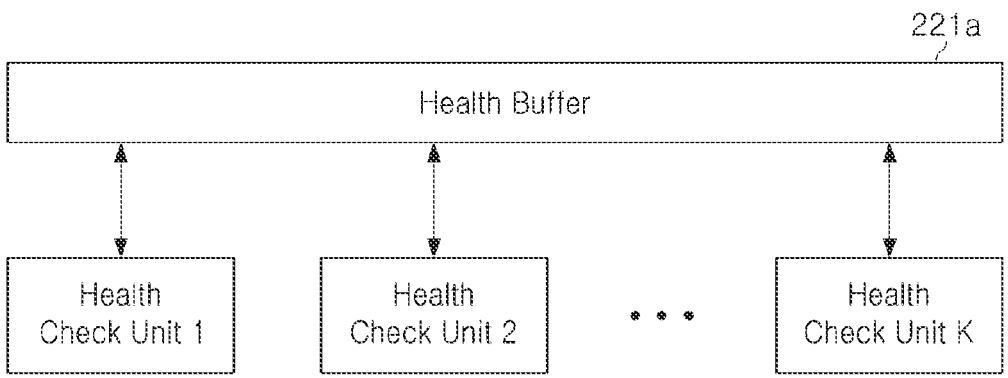

Referring to FIG. 5C, K health check units (where K is an integer equal to or greater than 3) may share a health buffer 221a storing target wordline information according to a background operation.

Figure 5D:
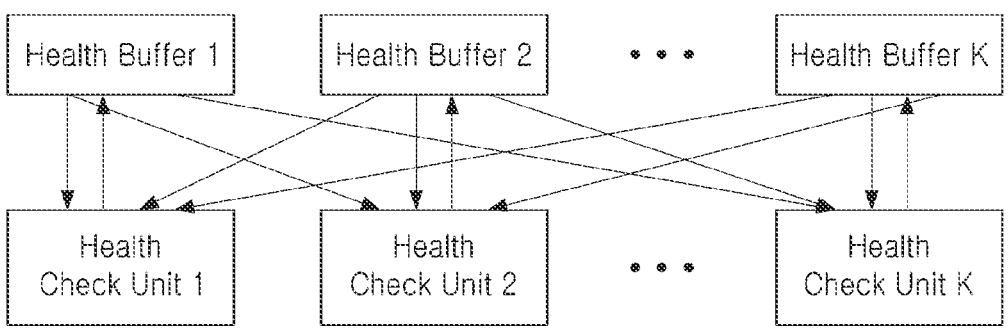

Referring to FIG. 5D, K health check units (where K is an integer equal to or greater than 3) may store target wordline information according to a background operation in K health buffers (where K is an integer equal to or greater than 3) corresponding thereto, respectively. In this case, each of the K health check units may perform a background operation corresponding thereto, using the target wordline information respectively stored in the K health buffers.

Figure 6:
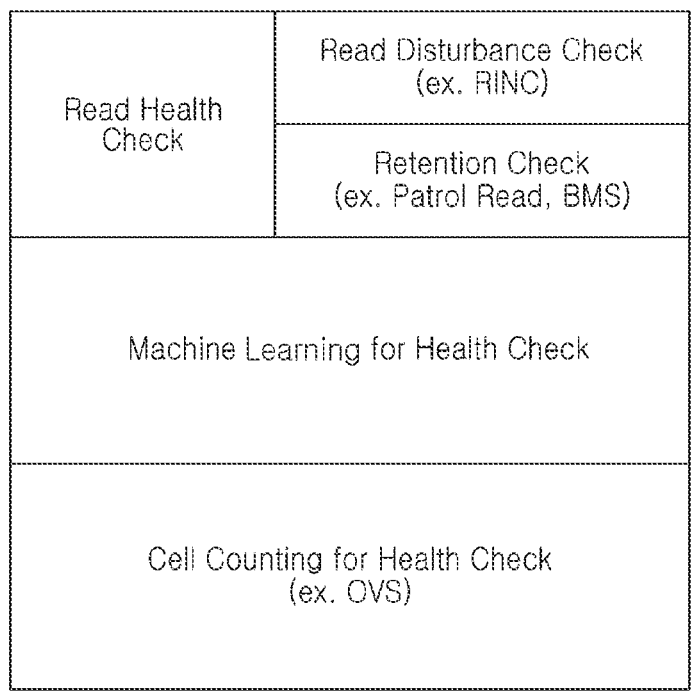
FIG. 6 is a diagram illustrating various health monitoring methods according to embodiments of the present disclosure.

FIG. 6 is a diagram illustrating various health monitoring methods according to embodiments of the present disclosure. Referring to FIG. 6, health monitoring methods may include a read health check method, a machine learning check method, and a cell counting check method.

The read health check method may broadly include a read disturbance check method and a retention check method.

In an embodiment, the read disturbance check method may include a random interval neighbor check (RINC) method. In this case, the RINC method may include a dummy read operation of at least one adjacent wordline or a dummy read operation of at least one open wordline, based on read count or degradation information of a memory block. The dummy read operation may be performed randomly. In this case, the open wordline may refer to an unselected wordline on which a program operation is not performed. The RINC method may be a defense code for checking WLs deteriorated by read stress and reclaiming when the number of error bits increases more than a certain amount. Details of the RINC method will be described in U.S. Pat. Nos. 9,406,390 and 9,613,711, which are incorporated herein by reference.

In an embodiment, the retention check method may include a patrol read method and a background media scan (BMS) method. In this case, the patrol read method may select at least one representative page from each memory blocks BLK1 to BLKz (refer to FIG. 1) and may include a background read operation on the selected representative page. The background read operation may be performed periodically. In this case, the BMS method may periodically include a background read operation for logical blocks according to a logical address. The patrol read method may be a defense code for performing a periodic health check on WLs vulnerable to retention characteristics and reclaiming when the number of error bits increases more than a certain amount. Details of the patrol lead and the BMS method will be described in U.S. Pat. No. 10,373,693, which is incorporated herein by reference.

The machine learning check method may monitor health of a memory cell by machine learning. The machine learning check method may be operated based on at least one of various machine learning algorithms such as a neural network algorithm, a support vector machine (SVM) algorithm, a linear regression algorithm, a decision tree algorithm, a generalized linear models (GLM) algorithm, a random forests algorithm, a gradient boosting machine (GBM) algorithm, a deep learning algorithm, a clustering algorithm, an abnormal detection algorithm, a dimension reduction algorithm, or the like. The machine learning check method may receive at least one parameter and may use the received parameter to predict error tendency for a memory block corresponding thereto, based on a training model that is previously trained. In an embodiment, the machine learning check method may be performed by a hardware accelerator configured to perform learning. Details of the machine learning check method will be described in U.S. Pat. No. 10,802,728, US 2020-0151539, US 2021-050067, and US 2021-0109669, which are incorporated herein by reference.

The cell counting check method may monitor health using cell count information. In an embodiment, the cell counting check method may include an on-chip valley search (OVS) operation. Details of the OVS operation will be described in US 2020-0098436, U.S. Pat. Nos. 10,090,046, 10,559,362, 10,607,708, and 10,629,259, which are incorporated herein by reference.

Meanwhile, it should be understood that various health check methods may be applied to the present disclosure, in addition to the check methods illustrated in FIG. 6.

A conventional defense code may be a defense code for an independent degradation model (read disturbance or retention). Therefore, there may be a limit as a defense code for a complex degradation model (read disturbance+retention). As a countermeasure against complex degradation, the present disclosure may perform a health check using a defense code performing a background read, may register a page in which a degradation level above a specific standard (e.g., an error bit or the like) is generated in a health buffer, and may perform an additional read of the page registered in the health buffer when a defense code periodically performs a patrol read or the like to prevent, in advance, performance degradation or an uncorrectable error correction code (UECC) failure due to complex stress.

A storage device 10 according to embodiments of the present disclosure may share at least one health buffer in different heterogeneous background read defense codes (e.g., RINC, patrol read, or the like). In an embodiment, when the background read defense codes are performed, a degradation level (e.g., an error bit or the like) may be checked by a health check and when the degradation level is equal to or higher than a standard, wordline (or address) information corresponding thereto may be registered in a shared health buffer. In an embodiment, when the background read defense codes are performed, a reclaim may be determined by performing an additional read defense code with reference to a shared health buffer.

Figure 7:
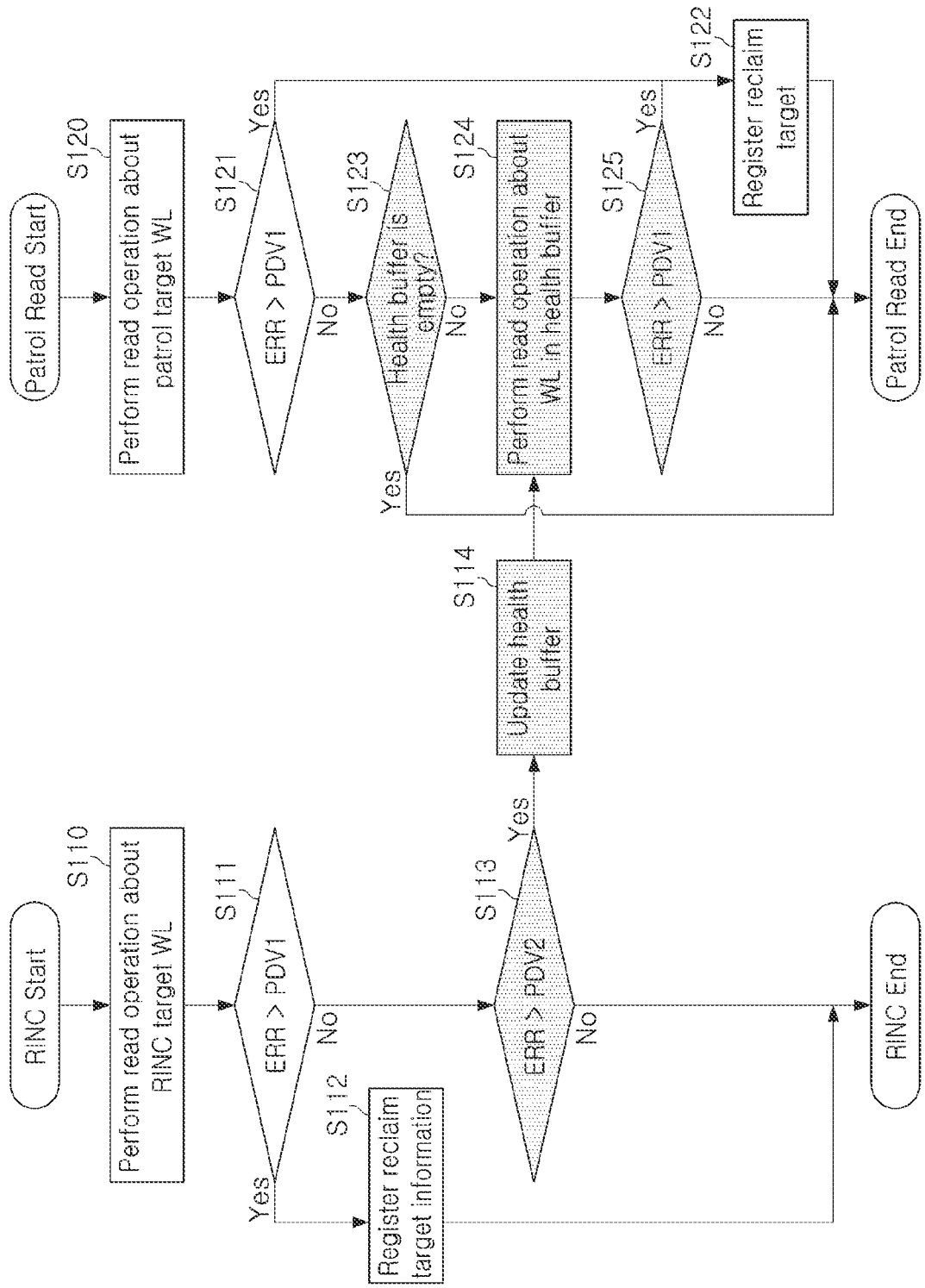
FIG. 7 is a diagram illustrating an operation of a storage device according to another embodiment of the present disclosure.

FIG. 7 is a diagram illustrating an operation of a storage device according to another embodiment of the present disclosure. Referring to FIG. 7, a storage device 10 may perform a background read operation as follows.

When a read operation is performed according to a read request from a host, a controller 200 (refer to FIG. 1) may start an RINC operation. A read operation (a first read operation) may be performed on at least one RINC target wordline vulnerable to read disturbance (S110).

By a result of the RINC operation, it may be determined whether the number of error bits ERR is greater than a first reference value PDV1 (S111). When the number of error bits ERR is greater than the first reference value PDV1, RINC target wordline information may be registered as a reclaim target (S112).

When the number of error bits ERR is not greater than the first reference value PDV1, it may be determined whether the number of error bits ERR is greater than a second reference value PDV2 (S113). In this case, the second reference value PDV2 may be smaller than the first reference value PDV1. When the number of error bits ERR is greater than the second reference value PDV2, RINC target wordline information corresponding thereto may be updated in a health buffer 221 (refer to FIG. 1) (S114). When the number of error bits ERR is not greater than the second reference value PDV2, the RINC operation may end.

Also, the controller 200 may periodically start a patrol read operation. A read operation (a second read operation) may be performed on a patrol target wordline (S120). By a result of the patrol read operation, it may be determined whether the number of error bits ERR is greater than the first reference value PDV1 (S121). When the number of error bits ERR is greater than the first reference value PDV1, patrol target wordline information may be registered as a reclaim target (S122).

When the number of error bits ERR is not greater than the first reference value PDV1, it may be determined whether the health buffer 221 is empty (S123). When the health buffer 221 is empty, the patrol read operation may end. When the health buffer 221 is not empty, a read operation (a third read operation) may be performed using wordline information stored in the health buffer 221 (S124). Thereafter, as a result of the read operation, it may be determined whether the number of error bits ERR is greater than the first reference value PDV1 (S125). When the number of error bits ERR is greater than the first reference value PDV1, operation S122 may be performed. For example, the wordline information stored in the health buffer 221 may be registered as a reclaim target.

When the number of error bits ERR is not greater than the first reference value PDV1, the patrol read operation may end.

A storage device 10 according to embodiments of the present disclosure may perform a health check on WLs (e.g., adjacent WLs and weak WLs) vulnerable to read disturbance when a host read is performed and may register WL information corresponding thereto in a specific health buffer when the number of error bits increases more than a specific threshold by read stress. In an embodiment, when a patrol read is performed, a health check may be performed on wordlines (WLs) vulnerable to predefined retention and wordline information registered in a health buffer. In an embodiment, when the number of error bits is equal to or greater than a specific reference value as a result of the health check, a reclaim operation may be performed.

Figure 8:
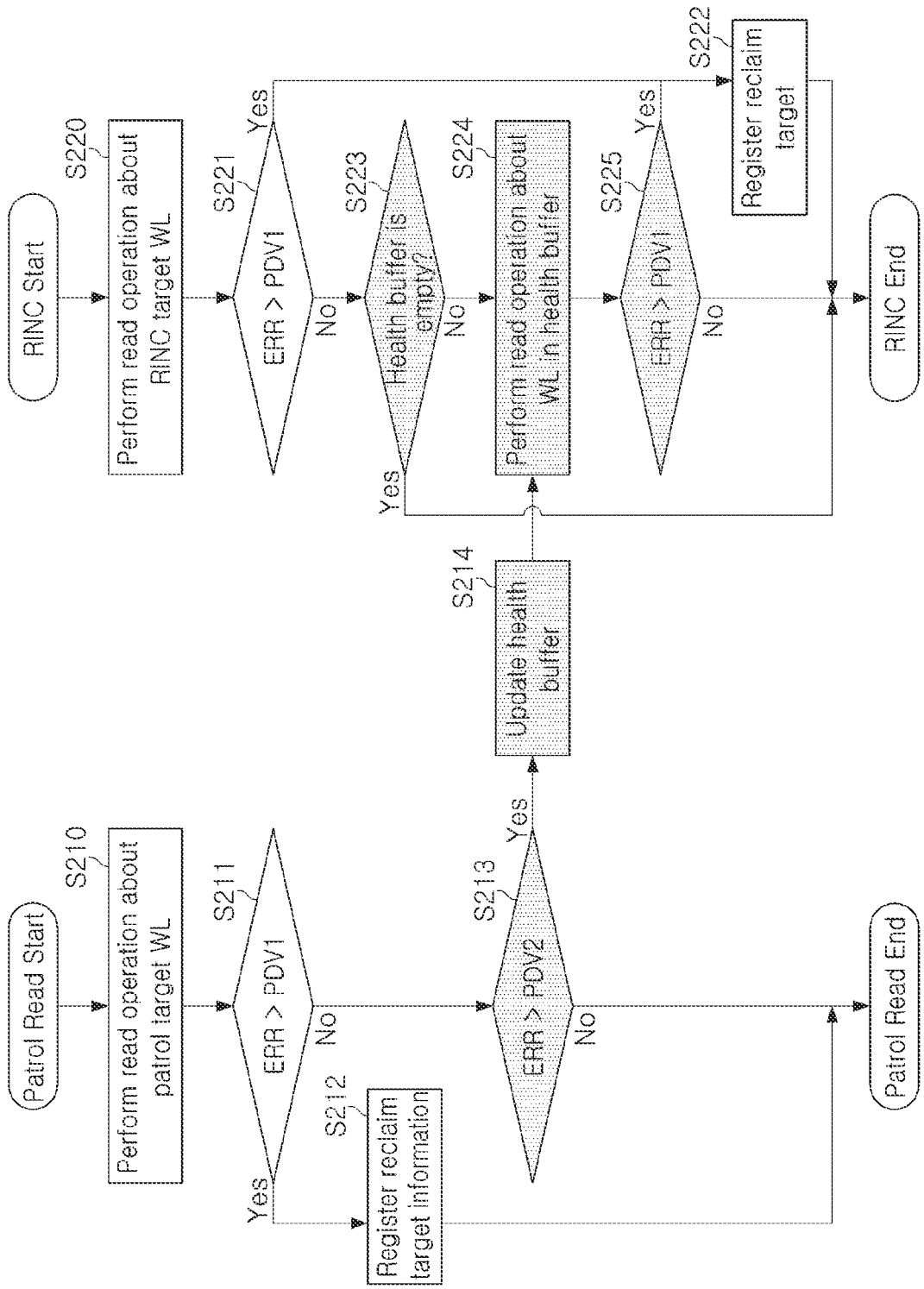
FIG. 8 is a diagram illustrating an operation of a storage device according to another embodiment of the present disclosure.

FIG. 8 is a diagram illustrating an operation of a storage device according to another embodiment of the present disclosure. Referring to FIG. 8, a storage device 10 may perform a background read operation as follows.

A controller 200 (refer to FIG. 1) may periodically start a patrol read operation. A read operation may be performed on a patrol target wordline (S210). By a result of the patrol read operation, it may be determined whether the number of error bits ERR is greater than a first reference value PDV1 (S211). When the number of error bits ERR is greater than the first reference value PDV1, patrol target wordline information may be registered as a reclaim target (S212).

When the number of error bits ERR is not greater than the first reference value PDV1, it may be determined whether the number of error bits ERR is greater than a second reference value PDV2 (S213). When the number of error bits ERR is greater than the second reference value PDV2, patrol target wordline information corresponding thereto may be updated in a health buffer 221 (S214). When the number of error bits ERR is not greater than the second reference value PDV2, the patrol read operation may end.

Also, the controller 200 may randomly start an RINC operation when performing a read operation according to a host request. A read operation may be performed on an RINC target wordline (S220). By a result of the RINC operation, it may be determined whether the number of error bits ERR is greater than the first reference value PDV1 (S221). When the number of error bits ERR is greater than the first reference value PDV1, RINC target wordline information may be registered as a reclaim target (S222).

When the number of error bits ERR is not greater than the first reference value PDV1, it may be determined whether the health buffer 221 is empty (S223). When the health buffer 221 is empty, the RINC operation may end. When the health buffer 221 is not empty, a read operation may be performed using wordline information stored in the health buffer 221 (S224). Thereafter, by a result of the read operation, it may be determined whether the number of error bits ERR is greater than the first reference value PDV1 (S225). When the number of error bits ERR is greater than the first reference value PDV1, operation S222 may be performed. For example, the wordline information stored in the health buffer 221 may be registered as a reclaim target. When the number of error bits ERR is not greater than the first reference value PDV1, the RINC operation may end.

The first reference value PDV1 serving as a reclaim registration criterion according to embodiments of the present disclosure and the second reference value PDV2 serving as the storage criterion in the health buffer 221 may be fixed values. Also, the first and second reference values PDV1 and PDV2 may be varied based on various variables.

Figure 9:
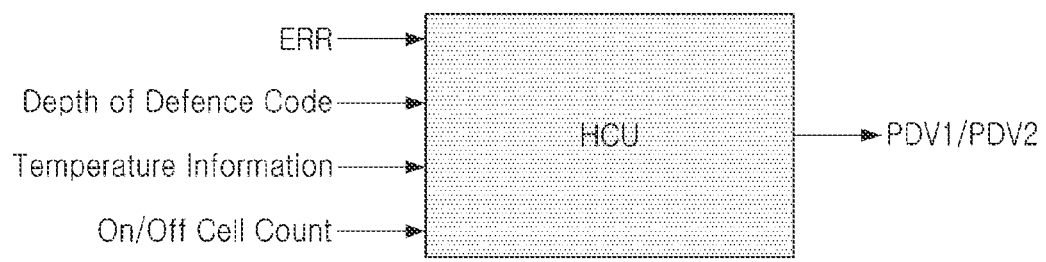
FIG. 9 is a diagram illustrating a health check unit (HCU) according to embodiments of the present disclosure.

FIG. 9 is a diagram illustrating a health check unit (HCU) according to embodiments of the present disclosure. Referring to FIG. 9, a health check unit (HCU) may be implemented to monitor health of a memory cell. The health check unit (HCU) may receive the number of error bits (ERR), a depth of defense codes (e.g., pre-defined table (PDT)=>least read estimation (LRE)/on-chip valley search (OVS)=>machine learning (ML)), temperature information, or on/off cell count information and may change at least one reference value (PDV1 or PDV2), which is a standard for reclaim registration.

A reclaim operation according to embodiments of the present disclosure may be initiated using various pieces of information.

Figure 10:
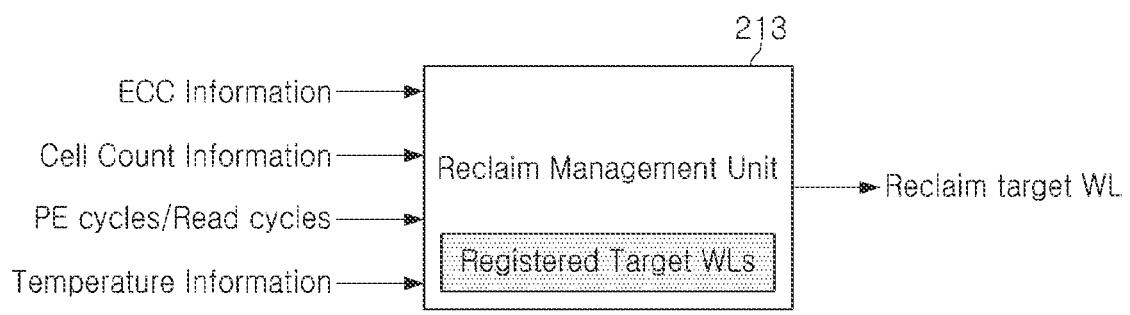
FIG. 10 is a diagram illustrating a reclaim management unit according to embodiments of the present disclosure.

FIG. 10 is a diagram illustrating a reclaim management unit 213 according to embodiments of the present disclosure. Referring to FIG. 10, a reclaim management unit 213 may initiate a reclaim operation for a registered wordline using error information, cell count information, PE cycles/read cycle information, or temperature information.

The storage device 10 illustrated in FIGS. 1 to 10 may be performing a reclaim operation using health information according to a background operation. However, it should be understood that the present disclosure is not limited thereto. The storage device according to embodiments of the present disclosure is not limited to the background operation and may perform a reclaim operation by a health monitoring unit monitoring health of a memory cell.

Figure 11:
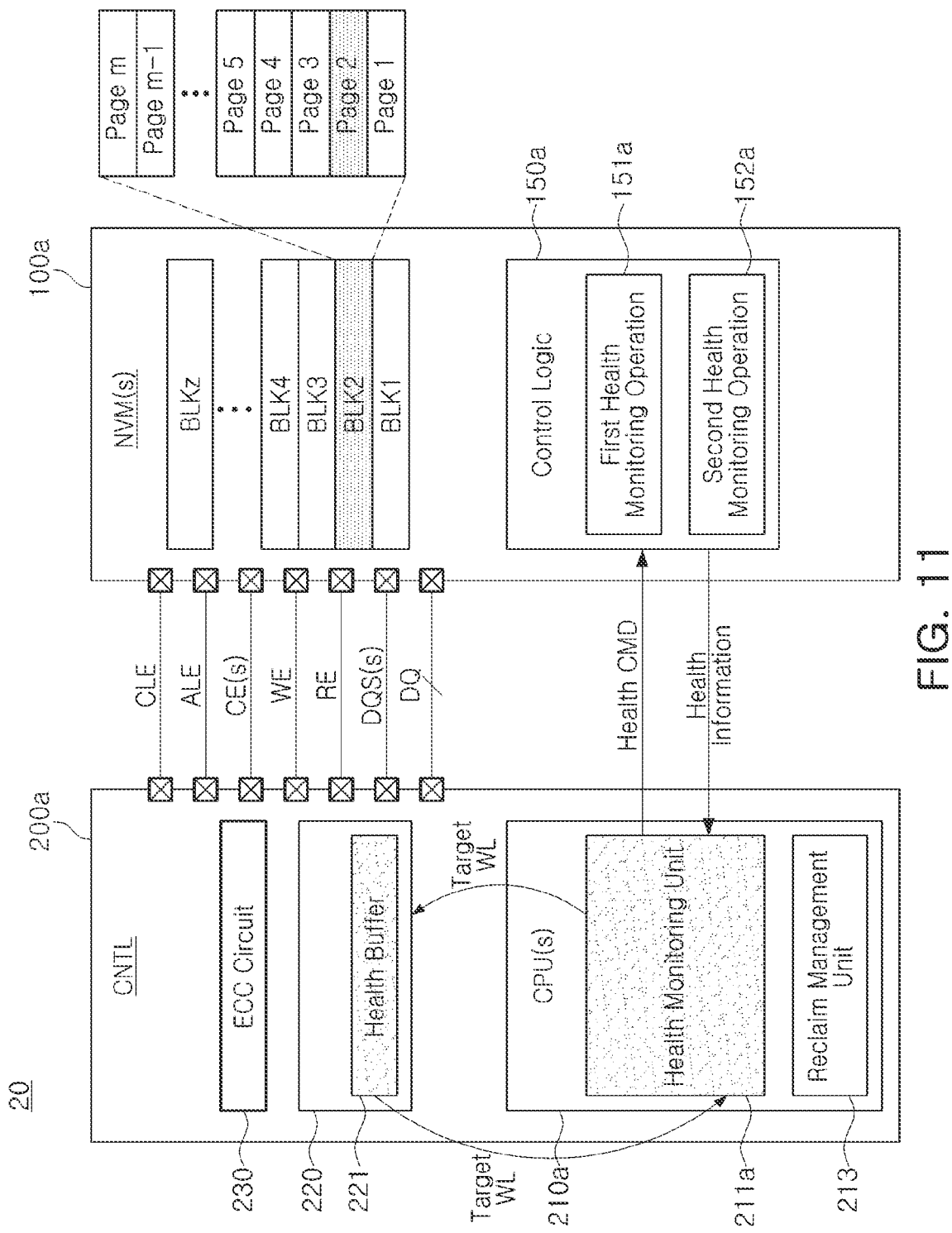
FIG. 11 is a diagram illustrating a storage device according to another embodiment of the present disclosure.

FIG. 11 is a diagram illustrating a storage device according to another embodiment of the present disclosure. Referring to FIG. 11, a storage device 20 may include a non-volatile memory device 100a and a controller 200a controlling the same. The controller 200a may issue a health command to the non-volatile memory device 100a and may receive health information from the non-volatile memory device 100a. In this case, the health information may be a result value of a health monitoring operation performed in response to the health command A control logic 150a of the non-volatile memory device 100a may perform one of first and second health monitoring operations 151a and 152a in response to the health command.

The controller 210a may include a health monitoring unit 211a controlling the health monitoring operation. The health monitoring unit 211a may perform various operations as well as a background operation for checking health of a memory cell. The health monitoring unit 211a may store target wordline information according to the second health monitoring operation 152a in a health buffer 221 and may use the target wordline information stored in the health buffer 221 in the first health monitoring operation 151a.

Figure 12:
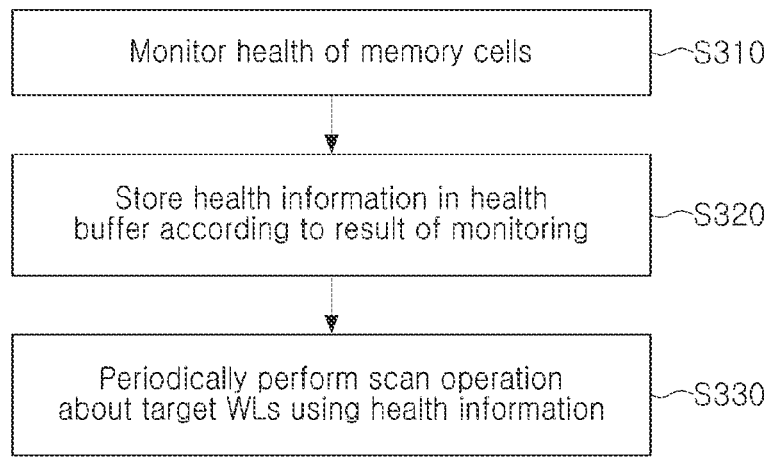
FIG. 12 is a flowchart illustrating an operation of a storage device according to embodiments of the present disclosure.

FIG. 12 is a flowchart illustrating an operation of a storage device according to embodiments of the present disclosure. Referring to FIGS. 1 to 12, a method of operating a storage device for improving reliability for stored data may be as follows. Health of memory cells may be monitored by a health monitoring unit (HCU) (S310). According to a result of a health monitoring operation, health information (e.g., target wordline information or target address information) may be stored in a health buffer (S320). A scan operation for the target wordline may be periodically performed using the health information (S330).

Figure 13:
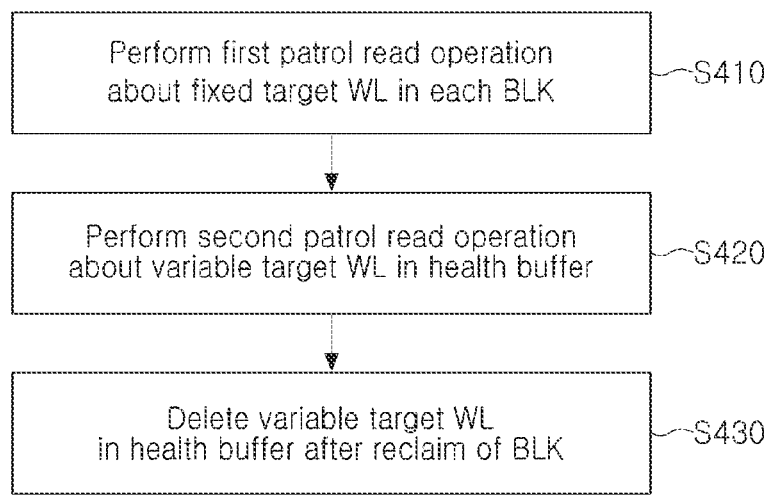
FIG. 13 is a flowchart illustrating an operation of a storage device according to another embodiment of the present disclosure.

FIG. 13 is a flowchart illustrating an operation of a storage device according to another embodiment of the present disclosure. Referring to FIGS. 1 to 13, a method of operating a storage device may be as follows. A first patrol read operation on a fixed target wordline for each memory block may be performed (S410). A second patrol read operation may be performed on a variable target wordline information stored in a health buffer (S420). After a reclaim operation on the memory block is performed, the variable target wordline information stored in the health buffer may be deleted (or cleared) (S430).

In an operation of the storage device according to embodiments of the present disclosure, a patrol read operation may be periodically performed on a predetermined address and a patrol read operation may be additionally performed in addition on another address.

Figure 14:
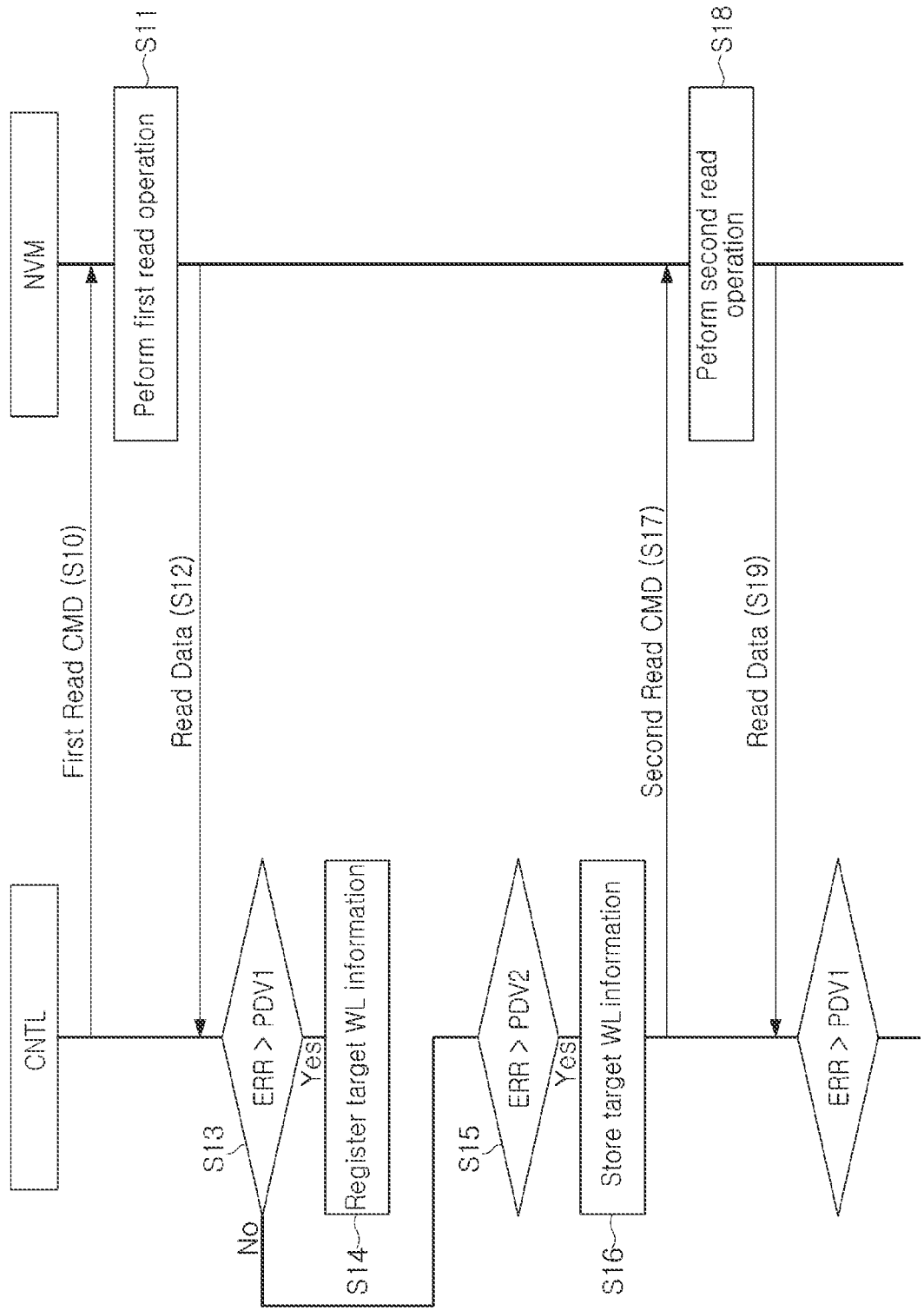
FIG. 14 is a ladder diagram illustrating a background read method of a storage device according to embodiments of the present disclosure.

FIG. 14 is a ladder diagram illustrating a background read method of a storage device according to embodiments of the present disclosure. Referring to FIGS. 1 to 14, a background read operation of a storage device may proceed as follows.

A controller CNTL may transmit a first read command to a non-volatile memory device NVM (S10). The non-volatile memory device NVM may perform a first read operation in response to the first read command (S11). Read data according to the first read operation may be transmitted to the controller CNTL (S12). The controller CNTL may perform an error correction operation on the read data and may determine whether the number of error bits ERR is greater than a first reference value PDV1 (S13). When the number of error bits ERR is greater than the first reference value PDV1, target wordline information may be registered as a reclaim target (S14). When the number of error bits ERR is not greater than the first reference value PDV1, it may be determined whether the number of error bits ERR is greater than a second reference value PDV2 (S15). In this case, the second reference value PDV2 may be smaller than the first reference value PDV1. When the number of error bits ERR is greater than the second reference value PDV2, the target wordline information may be stored in a health buffer (S16).

Thereafter, the controller CNTL may transmit a second read command to the non-volatile memory device NVM (S17). The non-volatile memory device NVM may perform a second read operation in response to the second read command (S18). The second read operation may include a read operation on the target wordline information stored in the health buffer. The read data according to the second read operation may be output to the controller CNTL (S19).

A storage device according to embodiments of the present disclosure may perform health monitoring in connection with an OVS operation.

Figure 15:
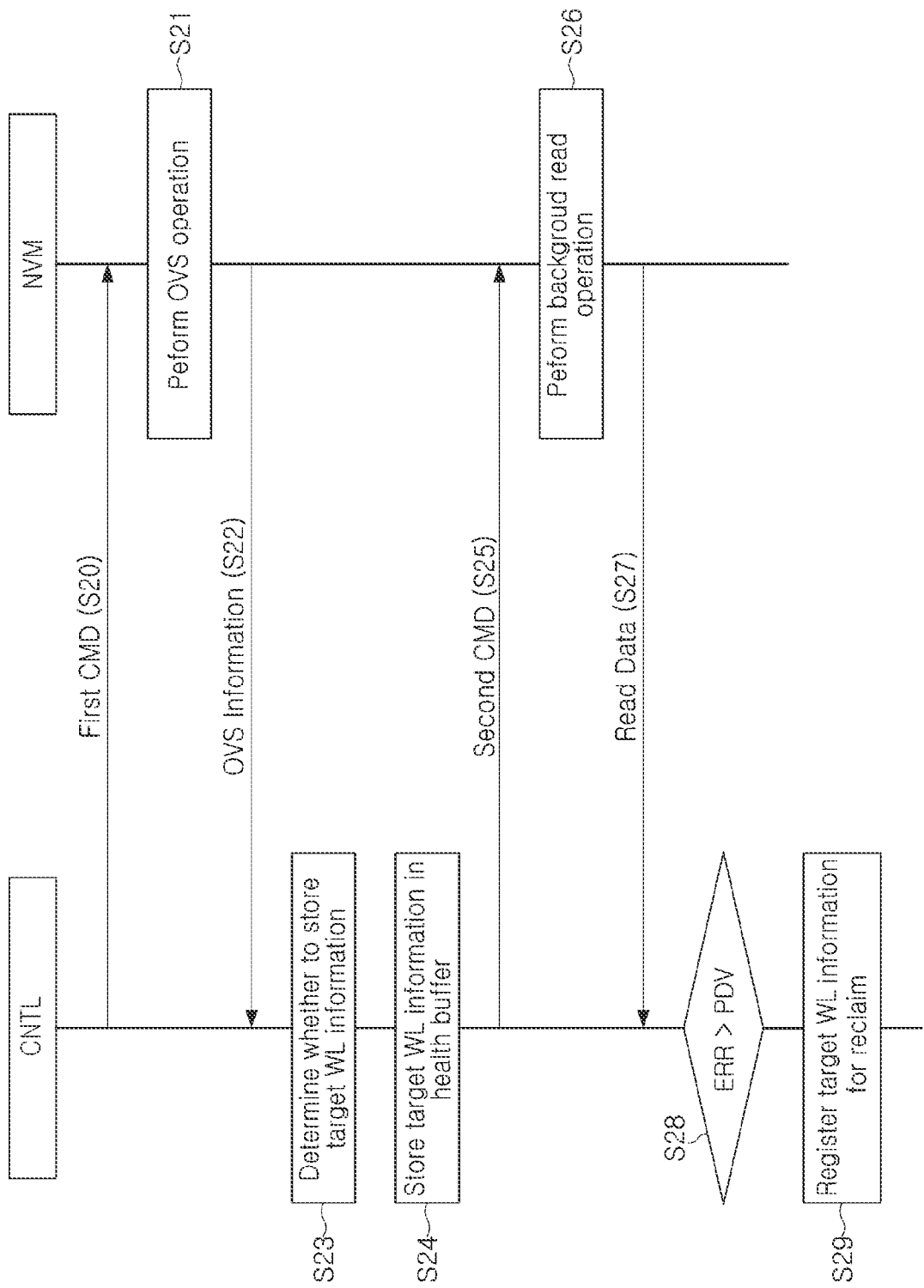
FIG. 15 is a ladder diagram illustrating a background read method of a storage device according to another embodiment of the present disclosure.

FIG. 15 is a ladder diagram illustrating a background read method of a storage device according to another embodiment of the present disclosure. Referring to FIGS. 1 to 13 and 15, a background read operation of a storage device may proceed as follows.

A controller CNTL may transmit a first command for an OVS operation to a non-volatile memory device NVM (S20). The non-volatile memory device NVM may perform an OVS operation in response to the first command (S21). The non-volatile memory device NVM may output OVS information according to the OVS operation to the controller CNTL (S22). In an embodiment, the OVS information may be output using a UIB out or may be output in response to a special command (e.g., a get feature command, a status read command, or the like).

The controller CNTL may determine whether to store target wordline information in a health buffer, based on the OVS information (S23). When it is necessary to closely monitor the target wordline information, the target wordline information may be stored in the health buffer (S24).

The controller CNTL may transmit a second command to the non-volatile memory device NVM for a background read operation on the target wordline information (S25). The non-volatile memory device NVM may perform a background read operation on the target wordline information in response to the second command (S26). The non-volatile memory device NVM may output read data according to the background read operation to the controller CNTL (S27).

The controller CNTL may perform an error correction operation on the read data and may determine whether the number of error bits ERR according to a result of the error correction operation exceeds a reference value PDV (S28). When the number of error bits ERR is greater than the reference value PDV, the target wordline information may be registered as a reclaim target (S29).

Figure 16:
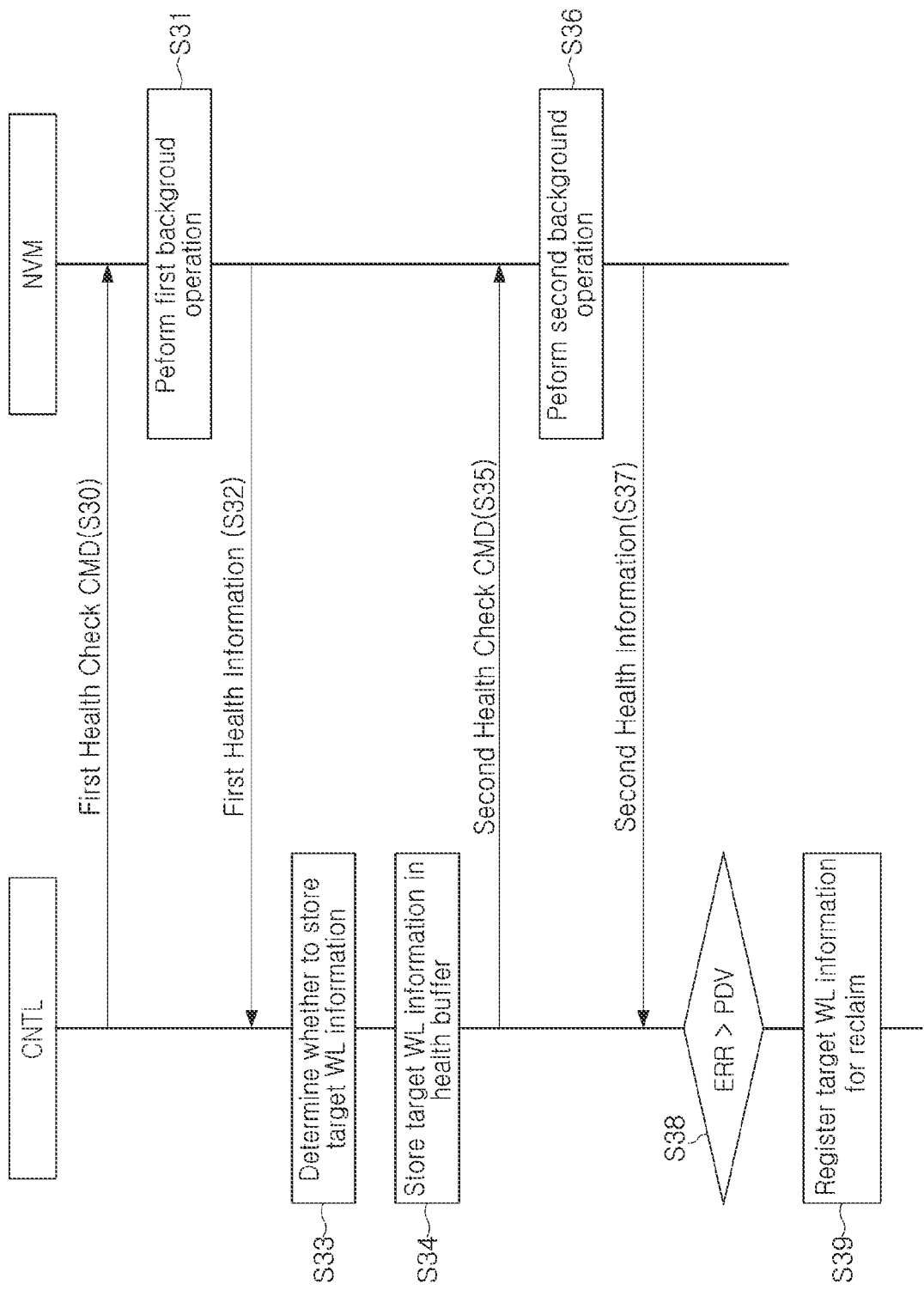
FIG. 16 is a ladder diagram illustrating a background read method of a storage device according to another embodiment of the present disclosure.

FIG. 16 is a ladder diagram illustrating a background read method of a storage device according to another embodiment of the present disclosure. Referring to FIGS. 1 to 13 and 16, a background read operation of a storage device may proceed as follows.

A controller CNTL may transmit a first health check command for health monitoring to a non-volatile memory device NVM (S30). The non-volatile memory device NVM may perform a first background operation in response to the first health check command (S31). The non-volatile memory device NVM may output first health information according to the first background operation to the controller CNTL (S32).

The controller CNTL may determine whether to store target wordline information in a health buffer, based on the first health information (S33). When it is necessary to closely monitor the target wordline information, the target wordline information may be stored in the health buffer (S34).

The controller CNTL may transmit a second health check command for health monitoring to the non-volatile memory device NVM (S35). The non-volatile memory device NVM may perform a second background read operation in response to the second health check command (S36). In this case, the second background read operation may include a read operation for the target wordline information stored in the health buffer. The non-volatile memory device NVM may output read data according to the second background read operation to the controller CNTL (S37).

The controller CNTL may perform an error correction operation on the read data and may determine whether the number of error bits ERR according to a result of the error correction operation exceeds a reference value PDV (S38). When the number of error bits ERR is greater than the reference value PDV, the target wordline information may be registered as a reclaim target (S39).

A storage device according to embodiments of the present disclosure may include an artificial processor dedicated to health monitoring.

Figure 17:
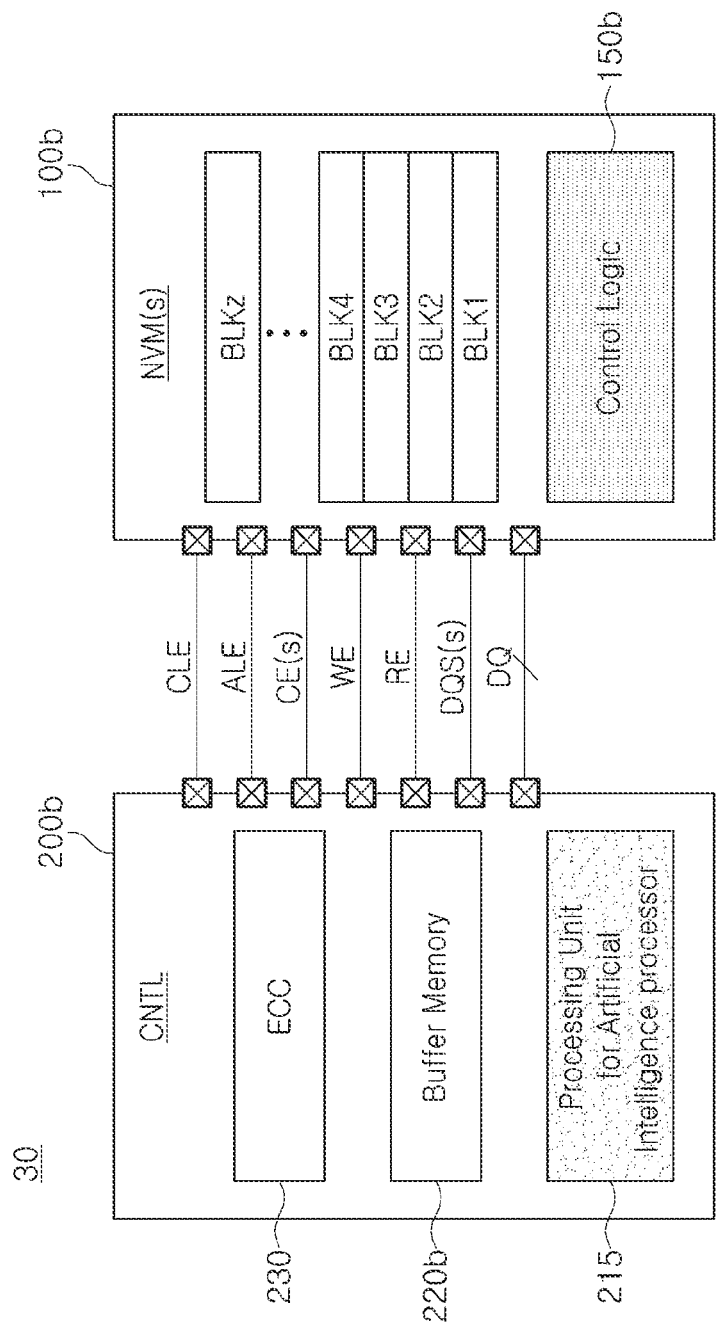
FIG. 17 is a diagram illustrating a storage device according to another embodiment of the present disclosure.

FIG. 17 is a diagram illustrating a storage device according to another embodiment of the present disclosure. Referring to FIG. 17, a controller 200*b* of a storage device 30 may include a buffer memory 220*b* and an artificial intelligence processor 215 that executes a health monitoring operation in comparison with that illustrated in FIG. 1. The artificial intelligence processor 215 may be implemented to manage the health monitoring operation and the reclaim operation, described in FIGS. 1 to 16. A non-volatile memory device 100*b* may include a control logic 150*b* that performs a health monitoring operation or a reclaim operation under control of the artificial intelligence processor 215.

A non-volatile memory device according to embodiments of the present disclosure may be implemented in a chip to chip (C2C) structure.

Figure 18:
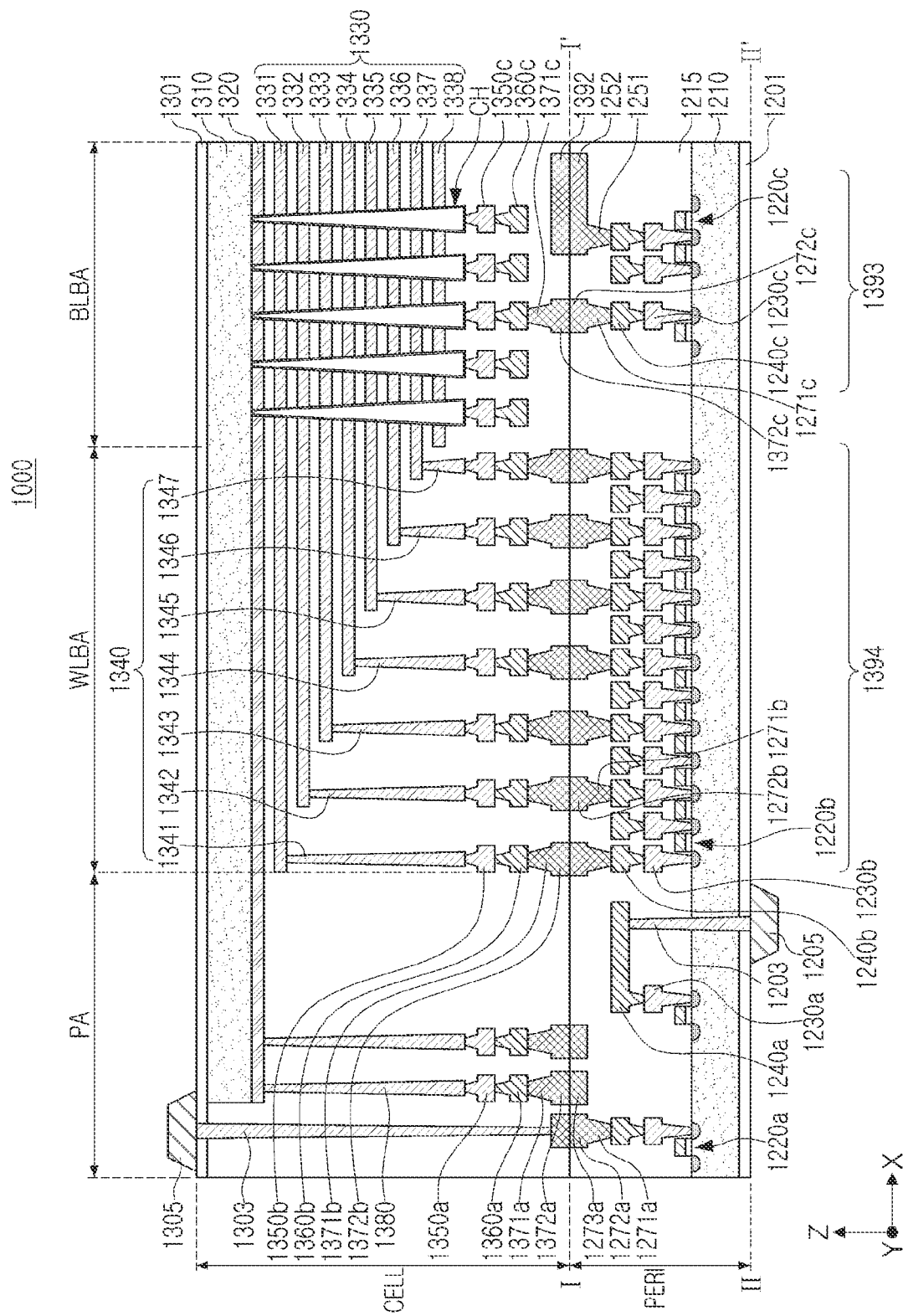
FIG. 18 is a diagram illustrating a non-volatile memory device implemented in a C2C structure according to embodiments of the present disclosure.

FIG. 18 is a diagram illustrating a non-volatile memory device 1000 implemented in a C2C structure according to embodiments of the present disclosure. In this case, a C2C structure may indicate that an upper chip including a cell region CELL is prepared on a first wafer, a lower chip including a peripheral circuit region PERI is prepared on a second wafer, different from the first wafer, and the upper chip and the lower chip are connected to each other by a bonding method. For example, the bonding method may be a method of electrically connecting a bonding metal formed on an uppermost metal layer of the upper chip and a bonding metal formed on an uppermost metal layer of the lower chip. In an embodiment, when the bonding metal is formed of copper (Cu), the bonding method may be a Cu—Cu bonding method. In another embodiment, the bonding metal may be formed of aluminum (Al) or tungsten (W).

Each of the peripheral circuit region PERI and the cell region CELL of the non-volatile memory device 1000 may include an external pad bonding area PA, a wordline bonding area WLBA, and a bit line bonding area BLBA.

The peripheral circuit region PERI may include a first substrate 1210, an interlayer insulating layer 1215, a plurality of circuit elements 1220*a*, 1220*b*, and 1220*c* formed on the first substrate 1210, first metal layers 1230*a*, 1230*b*, and 1230*c* respectively connected to the plurality of circuit elements 1220*a*, 1220*b*, and 1220*c*, and second metal layers 1240*a*, 1240*b*, and 1240*c* respectively formed on the first metal layers 1230*a*, 1230*b*, and 1230*c*. In an embodiment, the first metal layers 1230*a*, 1230*b*, and 1230*c* may be formed of tungsten having a relatively high resistivity. In an embodiment, the second metal layers 1240*a*, 1240*b*, and 1240*c* may be formed of copper having a relatively low resistivity.

As illustrated in FIG. 18, the first metal layers 1230*a*, 1230*b*, and 1230*c* and the second metal layers 1240*a*, 1240*b*, and 1240*c* are illustrated, but the present disclosure will not be limited thereto. At least one metal layer may be further formed on the second metal layers 1240*a*, 1240*b*, and 1240*c*. At least a portion of the one or more metal layers formed on the second metal layers 1240*a*, 1240*b*, and 1240*c* may be formed of aluminum having a resistivity different from that of copper forming the second metal layers 1240a, 1240b, and 1240c.

In an embodiment, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an embodiment, the interlayer insulating layer 1215 may include an insulating material such as silicon oxide, silicon nitride, or the like.

Lower bonding metals 1271b and 1272b may be formed on the second metal layer 1240b of the wordline bonding area WLBA. In the wordline bonding area WLBA, the lower bonding metals 1271b and 1272b of the peripheral circuit region PERI may be electrically connected to upper bonding metals 1371b and 1372b of the cell region CELL by a bonding method. In an embodiment, the lower bonding metals 1271b and 1272b and the upper bonding metals 1371b and 1372b may be formed of aluminum, copper, tungsten, or the like. Additionally, the upper bonding metals 1371b and 1372b of the cell region CELL may be referred to as first metal pads, and the lower bonding metals 1271b and 1272b may be referred to as second metal pads.

The cell region CELL may include at least one memory block. In an embodiment, the cell region CELL may include a second substrate 1310 and a common source line 1320. On the second substrate 1310, a plurality of wordlines 1331 to 1338 (i.e., 1330) may be stacked in a direction (a Z-axis direction), perpendicular to an upper surface of the second substrate 1310. In an embodiment, string select lines and a ground select line may be respectively disposed on and below of the wordlines 1330. In an embodiment, the plurality of wordlines 1330 may be disposed between the string select lines and the ground select line.

In the bit line bonding area BLBA, a channel structure CH may extend in a direction (the Z-axis direction), perpendicular to the upper surface of the second substrate 1310, to pass through the wordlines 1330, the string select lines, and the ground select line. The channel structure CH may include a data storage layer, a channel layer and a buried insulating layer, and the channel layer may be electrically connected to a first metal layer 1350c and a second metal layer 1360c. For example, the first metal layer 1350c may be a bit line contact, and the second metal layer 1360c may be a bit line. In an embodiment, the bit line 1360c may extend in a first direction (a Y-axis direction), parallel to the upper surface of the second substrate 1310.

As illustrated in FIG. 18, a region in which the channel structure CH, the bit line 1360c, and the like are arranged may be defined as the bit line bonding area BLBA. In an embodiment, the bit line 1360c may be electrically connected to the circuit elements 1220c providing a page buffer 1393 in the peripheral circuit region PERI, in the bit line bonding area BLBA. For example, the bit line 1360c may be connected to upper bonding metals 1371c and 1372c in the peripheral circuit region PERI. In this case, the upper bonding metals 1371c and 1372c may be connected to lower bonding metals 1271c and 1272c connected to the circuit elements 1220c of the page buffer 1393. In the wordline bonding area WLBA, the wordlines 1330 may extend in a second direction (the X-axis direction), parallel to the upper surface of the second substrate 1310. In an embodiment, the wordline bonding area WLBA may be connected to a plurality of cell contact plugs 1341 to 1347 (i.e., 1340). For example, the wordlines 1330 and the cell contact plugs 1340 may be connected to each other by pads provided with at least a portion of the wordlines 1330 extending in the second direction and having different lengths. In an embodiment, the first metal layer 1350b and the second metal layer 1360b may be sequentially connected to the cell contact plugs 1340 connected to the wordlines 1330. In an embodiment, the cell contact plugs 1340 may be connected to the peripheral circuit region PERI by the upper bonding metals 1371b and 1372b of the cell region CELL and the lower bonding metals 1271b and 1272b of the peripheral circuit region PERI in the wordline bonding area WLBA.

In an embodiment, the cell contact plugs 1340 may be electrically connected to the circuit elements 1220b providing the row decoder 1394 in the peripheral circuit region PERI. In an embodiment, operating voltages of the circuit elements 1220b providing the row decoder 1394 may be different from operating voltages of the circuit elements 1220c providing a page buffer 1393. For example, the operating voltages of the circuit elements 1220c providing the page buffer 1393 may be greater than the operating voltages of the circuit elements 1220b providing the row decoder 1394.

A common source line contact plug 1380 may be disposed in the external pad bonding area PA. In an embodiment, the common source line contact plug 1380 may be formed of a conductive material such as a metal, a metal compound, polysilicon, or the like. The common source line contact plug 1380 may be electrically connected to the common source line 1320. A first metal layer 1350a and a second metal layer 1360a may be sequentially stacked on the common source line contact plug 1380. For example, an area in which the common source line contact plug 1380, the first metal layer 1350a, and the second metal layer 1360a are arranged may be defined as the external pad bonding area PA. The second metal layer 1360a may be electrically connected to an upper metal via 1371a. The upper metal via 1371a may be electrically connected to an upper metal pattern 1372a.

Input/output pads 1205 and 1305 may be arranged in the external pad bonding area PA. Referring to FIG. 18, a lower insulating layer 1201 covering a lower surface of the first substrate 1210 may be formed below the first substrate 1210. Also, a first input/output pad 1205 may be formed on the lower insulating layer 1201. In an embodiment, the first input/output pad 1205 may be connected to at least one of a plurality of circuit elements 1220a, 1220b, and 1220c, arranged in the peripheral circuit region PERI, by a first input/output contact plug 1203. In an embodiment, the first input/output pad 1205 may be separated from the first substrate 1210 by the lower insulating layer 1201. In addition, since a lateral insulating layer may be disposed between the first input/output contact plug 1203 and the first substrate 1210, the first input/output contact plug 1203 and the first substrate 1210 may be electrically separated.

Referring to FIG. 18, an upper insulating layer 1301 may be formed on the second substrate 1310 to cover the upper surface of the second substrate 1310. Also, a second input/output pad 1305 may be disposed on the upper insulating layer 1301. In an embodiment, the second input/output pad 1305 may be connected to at least one of a plurality of circuit elements 1220a, 1220b, and 1220c, arranged in the peripheral circuit region PERI, by a second input/output contact plug 1303, a lower metal pattern 1272a, and a lower metal via 1271a.

In an embodiment, the second substrate 1310, the common source line 1320, and the like may not be disposed in an area where the second input/output contact plug 1303 is disposed. Also, the second input/output pad 1305 may not overlap the wordlines 1380 in a third direction (the Z-axis direction). Referring to FIG. 18, the second input/output contact plug 1303 may be separated from the second substrate 1310 in a direction, parallel to the upper surface of the second substrate 1310. Also, the second input/output contact plug 1303 may pass through an interlayer insulating layer 1315 of the cell region CELL and may be connected to the second input/output pad 1305. In an embodiment, the second input/output pad 1305 may be electrically connected to the circuit element 1220a.

In an embodiment, the first input/output pad 1205 and the second input/output pad 1305 may be selectively formed. For example, the non-volatile memory device 1000 may include only the first input/output pad 1205 disposed on the first substrate 1201 or may include only the second input/output pad 1305 disposed on the second substrate 1301. In another embodiment, the non-volatile memory device 1000 may include both of the first input/output pad 1205 and the second input/output pad 1305.

A metal pattern of an uppermost metal layer in each of the external pad bonding area PA and the bit line bonding area BLBA included in each of the cell region CELL and the peripheral circuit region PERI may be present as a dummy pattern or the uppermost metal layer may be empty.

In the non-volatile memory device 1000 according to embodiments of the present disclosure, in the external pad bonding area PA, a lower metal pattern 1273a having the same shape as an upper metal pattern 1372a formed on the uppermost metal layer of the cell region CELL may be formed on the uppermost metal layer of the peripheral circuit region PERI, to correspond to the upper metal pattern 1372a of the cell region CELL. The lower metal pattern 1273a formed on the uppermost metal layer of the peripheral circuit region PERI may not be connected to a separate contact in the peripheral circuit region PERI. Similarly, in the external pad bonding area PA, an upper metal pattern having the same shape as a lower metal pattern formed on the uppermost metal layer of the peripheral circuit region PERI may be formed on the uppermost metal layer of the cell region CELL, to correspond to the lower metal pattern of the peripheral circuit region PERI.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu-to-Cu bonding.

Further, the lower bonding metals 1251 and 1252 may be formed on the metal layer in the bit line bonding area BLBA. In the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The present disclosure may perform a health check in a defense code executing a background read and may use the same it in a heterogeneous background read defense code, to improve reliability of storage.

The present disclosure may perform a health check when one background read defense code is executed, may store information thereof in one or more buffers, and may use information in a shared buffer when performing other background read defense codes, to execute an additional defense code. The present disclosure may detect a degradation state due to complex stress in advance to prevent reliability defects such as performance degradation or UECC. In the present disclosure, a heterogeneous defense code may share one or more buffers and the heterogeneous defense code may use health information executed by the one defense code using the information.

In general, a defense code performing a background read using the health check method may include an RINC (e.g., read disturb) and a patrol read (e.g., retention). The RINC may be a defense code checking WL deteriorated by read stress and reclaiming the same when the number of error bits increases more than a certain amount. The patrol read may be a defense code periodically performing a health check on a WL vulnerable to retention characteristics and reclaiming the same when the number of error bits increases more than a certain amount. The two defense codes may be defense codes for independent degradation models (read disturbance or retention), and there may be a hole as defense codes for complex degradation models (read disturbance+retention) that may occur in actual use.

As a countermeasure against complex degradation that may occur in actual use, the present disclosure may perform a health check, in performing a read, using a defense code performing a background read, may register WL (e.g., page) information in which degradation level above a specific standard (e.g., an error bit, temperature, or the like) is generated in a shared buffer (e.g., DRAM, SRAM, or the like), and may perform an additional read with reference to information of a buffer corresponding thereto when other background read defense codes are performed to prevent performance degradation/UECC failure due to complex stress.

Prevention defense codes currently in use may be designed for one reliability degradation. In complex stress (e.g., retention+read disturb or read disturb+temp bump) occurring in actual use, the currently used defense code may cause performance degradation and poor reliability such as UECC. In order to solve the problems, the present disclosure may have a buffer (e.g., DRAM or SRAM) sharing health information between different defense codes and may use the information in the buffer when performing defense codes, to check when degradation due to different stress occurs.

When operating an RINC defense code executing a background read, a health check may be performed on a WL (e.g., a page) performing the read in the RINC defense code, and when the health is above a certain threshold, health information may be updated in a specific buffer (e.g., DRAM, SRAM, or the like). When operating a patrol read defense code executing a heterogeneous background read, the existing defense code may be executed and, after referring to a buffer sharing health information, an additional read operation may be performed when there is information in the buffer. When the result of additional read exceeds the threshold, a reclaim may be performed. Through this, it is possible to detect degradation due to read disturb in the defense code targeting retention degradation in advance. Of course, in the opposite case, health information obtained through the patrol read defense code may be registered in the buffer and an additional read operation using buffer information in other defense codes such as RINC is also possible.

Threshold criteria to be registered in a buffer may be various factors such as an error bit, entry of a specific defense code, write/read temperature difference, and cell count at a specific Vth. Not only the health check method through a read, but also the information that may be obtained when the defense code is operated using machine learning technologies or the cell count such as OVS performed in NAND On-Chip may be used to obtain health information, and through this, an optimal defense code algorithm may be implemented by predicting a current degradation level, a type of stress received by corresponding cell, or the like, and using this information in other defense codes.

A non-volatile memory device, a controller for controlling the same, a storage device including the same, and a method of operating the same, according to embodiments of the present disclosure, may share health information in different health monitoring operations to improve reliability for data.

A non-volatile memory device, a controller for controlling the same, a storage device including the same, and a method of operating the same, according to embodiments of the present disclosure, may include a buffer memory sharing health information when performing different defense codes, to perform an appropriate reclaim operation for complex degradation characteristics.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been illustrated and described above, it will be apparent to those skilled in the art that modifications and variations could be made without departing from the scope of the present disclosure as defined by the appended claims.

What is claimed is:

1. A method of operating a storage device, the method comprising:
    performing a first read operation on at least one first target wordline upon a read request from a host device;
    determining whether the number of first error bits of read data according to the first read operation is greater than a first reference value;
    determining whether the number of first error bits is greater than a second reference value, when the number of first error bits is not greater than the first reference value;
    storing wordline information corresponding to the at least one first target wordline in a health buffer, when the number of first error bits is greater than the second reference value;
    performing a second read operation on at least one second target wordline;
    determining whether the number of second error bits of read data according to the second read operation is greater than the first reference value;
    determining whether the health buffer is empty, when the number of second error bits is not greater than the first reference value;
    performing a third read operation using the wordline information stored in the health buffer, when the health buffer is not empty; and
    determining whether the number of third error bits of read data according to the third read operation is greater than the first reference value.

2. The method of claim 1, further comprising registering the at least one first target wordline as a reclaim target, when the number of first error bits is greater than the first reference value.

3. The method of claim 1, further comprising registering the at least one second target wordline as a reclaim target, when the number of second error bits is greater than the first reference value.

4. The method of claim 1, further comprising registering a wordline corresponding to the wordline information stored in the health buffer as a reclaim target, when the number of third error bits is greater than the first reference value.

5. The method of claim 1, wherein:
    the first read operation is performed randomly,
    the second read operation is performed periodically, and
    the second read operation is periodically performed with respect to a predetermined address and is additionally performed with respect to an address stored in the health buffer.

6. The method of claim 1, wherein the first read operation is performed periodically and the second read operation is performed randomly.

7. The method of claim 1, wherein the first reference value is greater than the second reference value.

8. The method of claim 7, wherein the first reference value and the second reference value are variable according to error information, a depth of defense codes, temperature information, or on/off cell count information.

9. The method of claim 1, further comprising initiating a reclaim operation on registered target wordlines using error information, cell count information, program/erase cycles, read cycles, or temperature information.

10. The method of claim 1, wherein at least one of the first read operation, the second read operation, and the third read operation includes a background read operation.

11. A method of operating a controller, the method comprising:
    randomly transmitting a first command to a non-volatile memory device upon a read request from a host device;
    receiving first read data corresponding to the first command from the non-volatile memory device;
    determining whether the number of first error bits of the first read data is greater than a first reference value;

determining whether the number of first error bits is greater than a second reference value, when the number of first error bits is not greater than the first reference value;

storing target wordline information in a health buffer, when the number of first error bits is greater than the second reference value;

periodically transmitting a second command to the non-volatile memory device; and receiving second read data corresponding to the second command from the non-volatile memory device.

12. The method of claim 11, further comprising registering a wordline corresponding to the first command as a reclaim target when the number of first error bits of the first read data is greater than the first reference value.

13. The method of claim 11, wherein the periodically transmitting a second command comprises respectively transmitting the second command to a plurality of memory blocks, to read data connected to a target wordline indicating a target page.

14. The method of claim 13, wherein the periodically transmitting a second command further comprises transmitting the second command to read data corresponding to the target wordline information stored in the health buffer.

15. The method of claim 11, further comprising registering a wordline corresponding to the second command as a reclaim target, when the number of second error bits of the second read data is greater than the first reference value.

* * * * *